US012763152B2

(12) United States Patent
Yang

(10) Patent No.: US 12,763,152 B2
(45) Date of Patent: Oct. 13, 2026

(54) PAGE BUFFER CIRCUIT AND MEMORY DEVICE INCLUDING THE SAME

(71) Applicant: Samsung Electronics Co., Ltd., Suwon-si (KR)

(72) Inventor: Hyungyu Yang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 21 days.

(21) Appl. No.: 18/973,603

(22) Filed: Dec. 9, 2024

(65) Prior Publication Data

US 2025/0259686 A1 Aug. 14, 2025

(30) Foreign Application Priority Data

Feb. 14, 2024 (KR) ........................ 10-2024-0021266

(51) Int. Cl.
*G11C 11/34* (2006.01)
*G11C 16/04* (2006.01)
*G11C 16/26* (2006.01)

(52) U.S. Cl.
CPC .......... *G11C 16/26* (2013.01); *G11C 16/0483* (2013.01)

(58) Field of Classification Search
CPC ............................ G11C 16/26; G11C 16/0483
USPC ..................................................... 365/185.21
See application file for complete search history.

(56) References Cited

U.S. PATENT DOCUMENTS 6,813,184 B2 * 11/2004 Lee .................... G11C 16/3454 365/185.09
6,963,502 B2 11/2005 Park
7,260,670 B2 8/2007 Kawai
7,391,649 B2 * 6/2008 Kang ................. G11C 16/0483 365/205
7,457,158 B2 * 11/2008 Lee ........................ G11C 16/12 365/185.12
7,495,968 B2 * 2/2009 Lee .................... G11C 16/3459 365/185.12
(Continued)

FOREIGN PATENT DOCUMENTS

CN 112634969 A 4/2021
CN 117594099 A * 2/2024 ............ H10W 80/00
(Continued)

OTHER PUBLICATIONS

H. Maejima, et al. 'A 512Gb 3b/Cell 3D Flash Memory on a 96-Word-Line-Layer Technology' IEEE, ISSCC 2018, Session 20, Flash-Memory Solutions, 201., pp. 336-337.

*Primary Examiner* — Viet Q Nguyen
(74) *Attorney, Agent, or Firm* — Fish & Richardson P.C.

(57) ABSTRACT

A memory device includes a memory cell array including memory cells and a page buffer circuit including page buffer units respectively connected to the memory cells through a plurality of bit lines and cache latches respectively corresponding to the page buffer units, each of the page buffer units including a main latch and a pass transistor, each connected to a corresponding sensing node, sensing nodes of at least first, second, and third page buffer units of the page buffer units connected to one another through pass transistors of the first, second, and third page buffer units, and a main latch of the first page buffer unit configured to perform a first data dump operation of transferring first data to a main latch of the second page buffer unit in a first time period of a data dump period.

20 Claims, 21 Drawing Sheets

(56) References Cited

U.S. PATENT DOCUMENTS

| | | | | |
|---|---|---|---|---|
| 7,535,775 | B2 * | 5/2009 | Kang | G06T 1/60 365/189.08 |
| 7,567,463 | B2 | 7/2009 | Hosono et al. | |
| 7,679,133 | B2 | 3/2010 | Son et al. | |
| 7,808,825 | B2 | 10/2010 | Park | |
| 8,553,466 | B2 | 10/2013 | Han et al. | |
| 8,559,235 | B2 | 10/2013 | Yoon et al. | |
| 8,654,587 | B2 | 2/2014 | Yoon et al. | |
| 10,957,384 | B1 | 3/2021 | Hung et al. | |
| 11,205,484 | B2 | 12/2021 | Lee et al. | |
| 11,600,336 | B2 * | 3/2023 | Cho | G11C 16/24 |
| 11,646,064 | B2 * | 5/2023 | Cho | G11C 16/26 365/189.05 |
| 12,001,683 | B2 * | 6/2024 | Tak | G11C 7/106 |
| 12,190,984 | B2 * | 1/2025 | Yang | G11C 5/147 |
| 12,211,559 | B2 * | 1/2025 | Cho | G06F 12/0246 |
| 12,217,793 | B2 * | 2/2025 | Song | G11C 11/4094 |
| 12,423,246 | B2 * | 9/2025 | Lee | G06F 12/1408 |
| 12,505,868 | B2 * | 12/2025 | Shin | G11C 7/1057 |
| 12,555,639 | B2 * | 2/2026 | Cho | G11C 11/5642 |
| 12,567,467 | B2 * | 3/2026 | Shin | G11C 16/0483 |
| 12,580,593 | B2 * | 3/2026 | Cho | G11C 16/32 |
| 2009/0292860 | A1 | 11/2009 | Park | |
| 2011/0233648 | A1 | 9/2011 | Seol et al. | |
| 2020/0135282 | A1 | 4/2020 | Ko et al. | |
| 2025/0191662 | A1 * | 6/2025 | Choi | G11C 16/08 |
| 2026/0024589 | A1 * | 1/2026 | Park | G11C 16/0483 |

FOREIGN PATENT DOCUMENTS

| | | | | | |
|---|---|---|---|---|---|
| JP | 2007018689 | A | * | 1/2007 | G11C 16/26 |
| JP | 4334363 | B2 | | 9/2009 | |
| KR | 100514415 | B1 | * | 9/2005 | G11C 7/106 |
| KR | 20070050323 | A | * | 5/2007 | G06T 1/60 |
| KR | 10-0953044 | B1 | | 4/2010 | |
| KR | 10-2020-0098009 | A | | 8/2020 | |
| KR | 10-2022-0021375 | A | | 2/2022 | |
| KR | 20220021375 | A | * | 2/2022 | G11C 7/065 |
| KR | 10-2023-0068274 | A | | 5/2023 | |
| KR | 20230068274 | A | * | 5/2023 | G11C 16/10 |

* cited by examiner

PAGE BUFFER CIRCUIT AND MEMORY DEVICE INCLUDING THE SAME

CROSS-REFERENCE TO RELATED APPLICATION

This application is based on and claims priority under 35 U.S.C. § 119 to Korean Patent Application No. 10-2024-0021266, filed on Feb. 14, 2024, in the Korean Intellectual Property Office, the disclosure of which is incorporated by reference herein in its entirety.

BACKGROUND

The inventive concepts relate to memory devices, and more particularly, to memory devices including a page buffer circuit.

Recently, as information communication devices are multifunctional, it is desired to increase the capacity and integration degree of memory devices. Memory devices may include a page buffer circuit for storing data in memory cells or outputting data from the memory cells, and the page buffer circuit may include semiconductor devices such as a transistor.

The page buffer circuit may be connected to a plurality of bit lines and may sense data of a plurality of memory cells through the plurality of bit lines. It may be required to decrease the size of a page buffer circuit caused by an increase in degree of integration of memory devices.

SUMMARY

The inventive concepts provide memory devices including a page buffer circuit, which may perform a data dump operation between a plurality of main latches.

Also, the inventive concepts provide memory devices including a page buffer circuit, which may perform a data dump operation between a plurality of main latches and a data dump operation between a main latch and a cache latch in parallel.

A memory device according to some example embodiments includes a memory cell array including a plurality of memory cells and a page buffer circuit including a plurality of page buffer units respectively connected to the plurality of memory cells through a plurality of bit lines and a plurality of cache latches respectively corresponding to the plurality of page buffer units, each of the plurality of page buffer units including a main latch and a pass transistor, each connected to a corresponding sensing node, sensing nodes of at least first, second, and third page buffer units of the plurality of page buffer units connected to one another through pass transistors of the first, second, and third page buffer units, and a main latch of the first page buffer unit configured to perform a first data dump operation of transferring first data to a main latch of the second page buffer unit in a first time period of a data dump period.

A memory device according to some example embodiments includes a first semiconductor layer including a plurality of memory cells respectively connected to a plurality of bit lines and a second semiconductor layer above the first semiconductor layer, the second semiconductor layer including a page buffer circuit, the page buffer circuit including a main region including a plurality of page buffer units and a cache region including a plurality of cache latches respectively corresponding to the plurality of page buffer units, each of the plurality of page buffer units including a main latch and a pass transistor, each connected to a corresponding sensing node, sensing nodes of at least first, second, and third page buffer units of the plurality of page buffer units connected to one another through pass transistors of the first, second, and third page buffer units, and a main latch of the first page buffer unit configured to perform a first data dump operation of transferring first data to a main latch of the second page buffer unit in a first time period of a data dump period.

A page buffer circuit according to some example embodiments includes a plurality of page buffer units and a plurality of cache latches connected to the plurality of page buffer units through a coupling sensing node in common, each of the plurality of page buffer units including a main latch and a pass transistor, each connected to a corresponding sensing node, sensing nodes of at least first, second, and third page buffer units of the plurality of page buffer units connected to one another through pass transistors of the first, second, and third page buffer units, and a main latch of the first page buffer unit configured to perform a first data dump operation of transferring first data to a main latch of the second page buffer unit in a first time period of a data dump period.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, embodiments will be described in detail with reference to the accompanying drawings.

Figure 1:
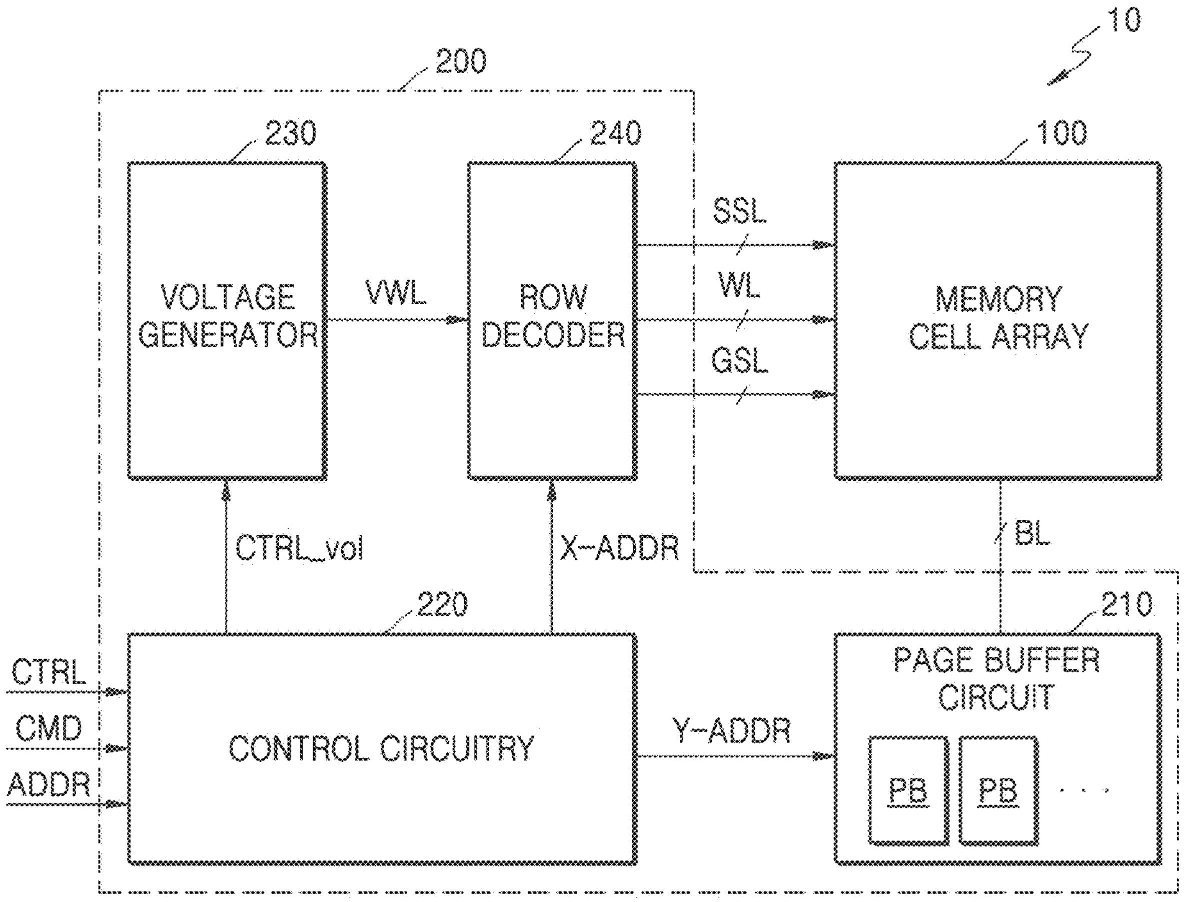
FIG. 1 is a block diagram illustrating a memory device according to some example embodiments.

FIG. 1 is a block diagram illustrating a memory device 10 according to some example embodiments.

Referring to FIG. 1, the memory device 10 may include a memory cell array 100 and a peripheral circuit 200, and the peripheral circuit 200 may include a page buffer circuit 210, a control circuit 220, a voltage generator 230, and a row decoder 240. Although not shown in FIG. 1, the peripheral circuit 200 may further include a data input/output (I/O) circuit or an I/O interface. Also, the peripheral circuit 200 may further include a column logic, a pre-decoder, a temperature sensor, a command decoder, and an address decoder.

The memory cell array 100 may be connected to the page buffer circuit 210 through bit lines BL and may be connected to the row decoder 240 through word lines WL, string selection lines SSL, and ground selection lines GSL. The memory cell array 100 may include a plurality of memory cells, and for example, the memory cells may be flash memory cells. Hereinafter, a case where the plurality of memory cells are NAND flash memory cells will be described as an example of embodiments. However, the inventive concepts are not limited thereto, and in some example embodiments, the plurality of memory cells may be resistive memory cells such as resistive random access memory (RAM) (ReRAM), phase change RAM (PRAM), or magnetic RAM (MRAM).

In some example embodiments, the memory cell array 100 may include a three-dimensional (3D) memory cell array, the 3D memory cell array may include a plurality of NAND strings, and each of the NAND strings may include memory cells respectively connected to word lines which are vertically stacked on a substrate. This is described below with reference to FIGS. 3 and 4. U.S. Pat. Nos. 7,679,133, 8,553,466, 8,654,587 and 8,559,235 and U.S. Patent Application No. 2011/0233648 disclose appropriate elements of a 3D memory array which includes a plurality of levels and in which word lines and/or bit lines are shared between the plurality of levels. In the present specification, the reference documents may be incorporated herein in their entirety by reference. However, the inventive concepts are not limited thereto, and in some example embodiments, the memory cell array 100 may include a 2D memory cell array, and the 2D memory cell array may include a plurality of NAND strings arranged in a row direction and a column direction.

The control circuit 220 may output various control signals (for example, a voltage control signal CTRL_vol, a row address X-ADDR, and a column address Y-ADDR) for programming data in the memory cell array 100, reading data from the memory cell array 100, or erasing data stored in the memory cell array 100, based on a command CMD, an address ADDR, and a control signal CTRL. Therefore, the control circuit 220 may overall control various operations of the memory device 10.

The voltage generator 230 may generate various kinds of voltages for a program operation, a read operation, and an erase operation on the memory cell array 100, based on the voltage control signal CTRL_vol. In detail, the voltage generator 230 may generate a word line voltage VWL, and for example, may generate a program voltage, a read voltage, a pass voltage, an erase verification voltage, or a program verification voltage. Also, the voltage generator 230 may further generate a string selection line voltage and a ground selection line voltage, based on the voltage control signal CTRL_vol.

In response to the row address X-ADDR, the row decoder 240 may select one memory block from among a plurality of memory blocks, select one word line WL from among word lines WL of the selected memory block, and select one string selection line SSL from among a plurality of string selection lines SSL. The page buffer circuit 210 may select some bit lines BL from among bit lines BL in response to the column address Y-ADDR. In detail, the page buffer circuit 210 may operate as a write driver or a sense amplifier, based on an operation mode.

The page buffer circuit 210 may include a plurality of page buffers PB respectively connected to a plurality of bit lines BL. In some example embodiments, sensing nodes (for example, SO0 to SOn of FIG. 5) of page buffer units (for example, PBU0 to PBUn of FIG. 5) included in each of the plurality of page buffers PB may be electrically connected to each other through pass transistors (for example, TF and TR' of FIG. 6). Cache latches (for example, CL0 to CLn of FIG. 5) included in each of the plurality of page buffers PB may be connected to a coupling sensing node SOC in parallel. The page buffer units (for example, first to $n^{th}$ page buffer units) PBU0 to PBUn may respectively correspond to the cache latches (for example, first to $n^{th}$ cache latches) CL0 to CLn. For example, the first page buffer unit PBU0 may sense data through a corresponding bit line BL and may provide sensed data to the first cache latch CL0 corresponding thereto.

In a sensing operation, the sensing nodes SO0 to SOn of the page buffer units PBU0 to PBUn included in each of the plurality of page buffers PB may be electrically disconnected from one another. In the sensing operation, each of the page buffer units PBU0 to PBUn may sense data through a corresponding bit line BL. In the sensing operation, the page buffer units PBU0 to PBUn may sense data in parallel.

In a data dump operation, the page buffer units PBU0 to PBUn may sequentially transfer the sensed data to the cache latches CL0 to CLn. In the data dump operation, it may be desired to connect a sensing node of a page buffer unit to a coupling sensing node connected to a cache latch.

Therefore, a sensing node of a selected page buffer unit may be electrically connected to sensing nodes between the coupling sensing node SOC and the sensing node of the selected page buffer unit.

As the number of sensing nodes between the coupling sensing node SOC and the sensing node of the selected page buffer unit increases, a capacitance and a resistance of the coupling sensing node SOC may increase, and a develop time of the coupling sensing node SOC may increase.

According to some example embodiments, in a first time period of the data dump operation, data stored in the first page buffer unit may be transferred to a second page buffer unit. In detail, while data of a third page buffer unit is being transferred to a corresponding cache latch, data stored in the first page buffer unit may be transferred to the second page buffer unit. In a second time period of the data dump operation, data stored in the second page buffer unit may be transferred to a corresponding cache latch.

A distance between the sensing node of the first page buffer unit and a coupling sensing node may be greater than a distance between the sensing node of the second page buffer unit and the coupling sensing node. The number of sensing nodes disposed between the sensing node of the first page buffer unit and the coupling sensing node may be greater than the number of sensing nodes disposed between the sensing node of the second page buffer unit and the coupling sensing node.

A distance between the sensing node of the second page buffer unit and a coupling sensing node SOC may be less than a distance between the sensing node of the first page buffer unit and the coupling sensing node SOC, and thus, data of the first page buffer unit of the coupling sensing node SOC may be previously transferred to the second page buffer unit, thereby shortening a develop time of the coupling sensing node SOC. Accordingly, a shortened data dump time may be provided.

Figure 2:
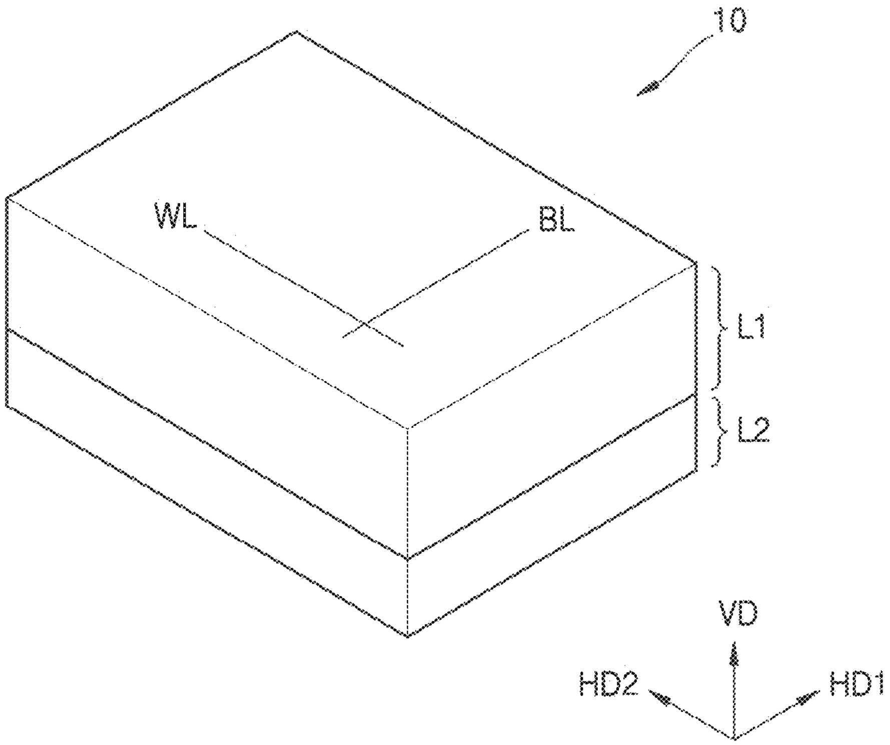
FIG. 2 is a diagram schematically illustrating a structure of the memory device of FIG. 1, according to some example embodiments.

FIG. 2 is a diagram schematically illustrating a structure of the memory device 10 of FIG. 1, according to some example embodiments. Referring to FIG. 2, the memory device 10 may include a first semiconductor layer L1 and a second semiconductor layer L2, and the first semiconductor layer L1 may be stacked in a vertical direction VD on the second semiconductor layer L2. In detail, the second semiconductor layer L2 may be disposed in the vertical direction VD under the first semiconductor layer L1, and thus, the second semiconductor layer L2 may be disposed close to a substrate.

In some example embodiments, the memory cell array 100 of FIG. 1 may be formed in the first semiconductor layer L1, and the peripheral circuit 200 of FIG. 1 may be formed in the second semiconductor layer L2. Therefore, the memory device 10 may have a structure (e.g., a cell over periphery (COP) structure) where the memory cell array 100 is disposed on the peripheral circuit 200. The COP structure may effectively decrease a horizontal-direction area and may enhance the degree of integration of the memory device 10.

In some example embodiments, the second semiconductor layer L2 may include the substrate, and transistors and metal patterns (for example, first and third lower metal layers LM0 and LM2) for wiring the transistors may be formed on the substrate, thereby forming the peripheral circuit 200 in the second semiconductor layer L2. After the peripheral circuit 200 is formed in the second semiconductor layer L2, the first semiconductor layer L1 including the memory cell array 100 may be formed, and metal patterns for electrically connecting word lines WL and bit lines BL of the memory cell array 100 to the peripheral circuit 200 formed in the second semiconductor layer L2 may be formed. For example, the bit lines BL may extend in a first horizontal direction HD1, and the word lines WL may extend in a second horizontal direction HD2.

With the advancement of a semiconductor process, as the number of stacks of memory cells disposed in the memory cell array 100 increases, namely, as the number of stacks of word lines WL increases, an area of the memory cell array 100 may decrease, and thus, an area of the peripheral circuit 200 may also be reduced. According to some example embodiments, in order to decrease an area of a region occupied by the page buffer circuit 210, the page buffer circuit 210 may have a structure where a page buffer unit is separated from a cache latch and may connect a coupling sensing node to sensing nodes included in each of page buffer units in common.

Figure 3:
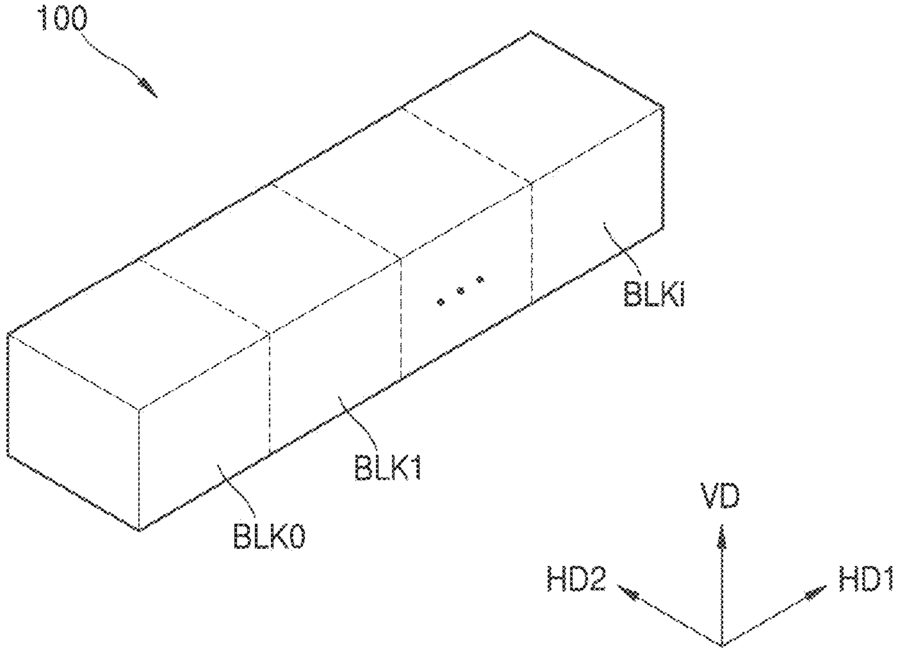
FIG. 3 is a diagram illustrating a memory cell array of FIG. 1, according to some example embodiments.

FIG. 3 is a diagram illustrating the memory cell array 100 of FIG. 1, according to some example embodiments. Referring to FIG. 3, the memory cell array 100 may include a plurality of memory blocks BLK0 to BLKi (where i may be a positive integer). Each of the plurality of memory blocks BLK0 to BLKi may have a three-dimensional (3D) structure (or a vertical structure). In detail, each of the plurality of memory blocks BLK0 to BLKi may include a plurality of NAND strings extending in the vertical direction VD. In this case, the plurality of NAND strings may be provided apart from one another by a certain distance in the first and second horizontal directions HD1 and HD2. The plurality of memory blocks BLK0 to BLKi may be selected by a row decoder (240 of FIG. 1). For example, the row decoder 240 may select a memory block corresponding to a block address from among the plurality of memory blocks BLK0 to BLKi.

Figure 4:
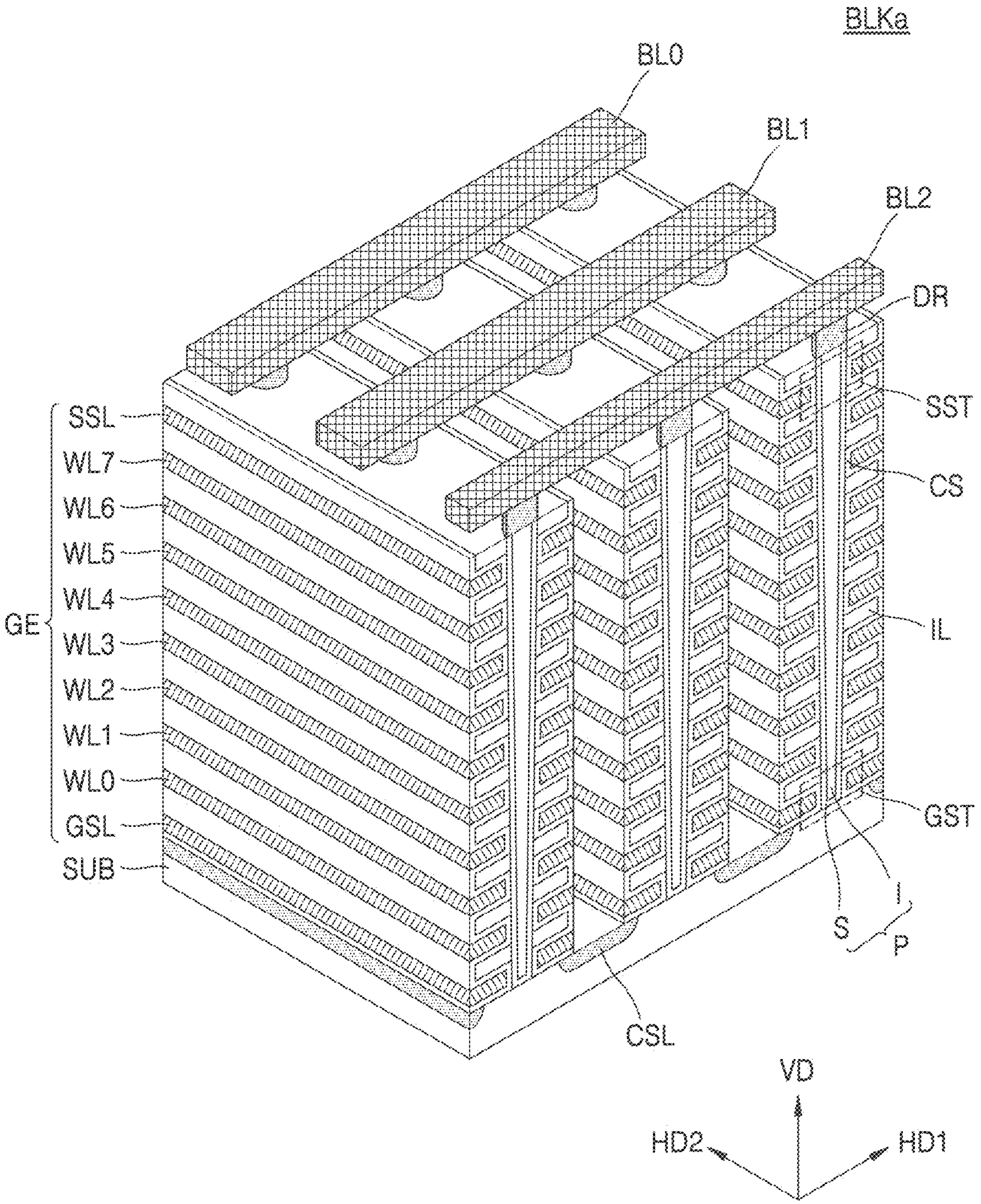
FIG. 4 is a perspective view illustrating a memory block of FIG. 3, according to some example embodiments.

FIG. 4 is a perspective view illustrating the memory block BLKa of FIG. 3, according to some example embodiments.

Referring to FIG. 4, the memory block BLKa may be formed in a vertical direction on a substrate SUB. The substrate SUB may be of a first conductive type (for example, a p type), and a common source line CSL which extends in a second horizontal direction HD2 and is doped with impurities of a second conductive type (for example, an n type) may be provided on the substrate SUB. A plurality of insulation layers IL extending in the second horizontal direction HD2 may be sequentially provided in a vertical direction VD in a region of the substrate SUB between two adjacent common source lines CSL, and the plurality of insulation layers IL may be apart from each other by a certain distance in the vertical direction VD. For example, the plurality of insulation layers IL may include an insulating material such as silicon oxide.

A plurality of pillars P which are sequentially arranged in the first horizontal direction HD1 and respectively pass through the plurality of insulation layers IL in the vertical direction VD may be provided in a region of the substrate SUB between two adjacent common source lines CSL. For example, the plurality of pillars P may pass through the plurality of insulation layers IL and may contact the substrate SUB. In detail, a surface layer of each of the pillars P may include a silicon material of a first type and may function as a channel region. Furthermore, an internal layer I of each pillar P may include an air gap or an insulating material such as silicon oxide.

A charge storage layer CS may be provided along the insulation layers IL, the pillars P, and an exposed surface of the substrate SUB, in a region between two adjacent common source lines CSL. The charge storage layer CS may include a gate insulation layer (or referred to as a tunneling insulation layer), a charge trap layer, and a blocking insulation layer. For example, the charge storage layer CS may have an oxide-nitride-oxide (ONO) structure. Also, a gate electrode GE such as word lines WL0 to WL7 and selection lines GSL and SSL may be provided on an exposed surface of the charge storage layer CS, in a region between two adjacent common source lines CSL.

Drains or drain contacts DR may be respectively provided on the plurality of pillars P. For example, the drains or the drain contacts DR may include a silicon material doped with impurities of a second conductive type. Bit lines BL1 to BL3 which extend in the first horizontal direction HD1 and are apart from one another by a certain distance in the second horizontal direction HD2 may be provided on the drains DR.

Figure 5:
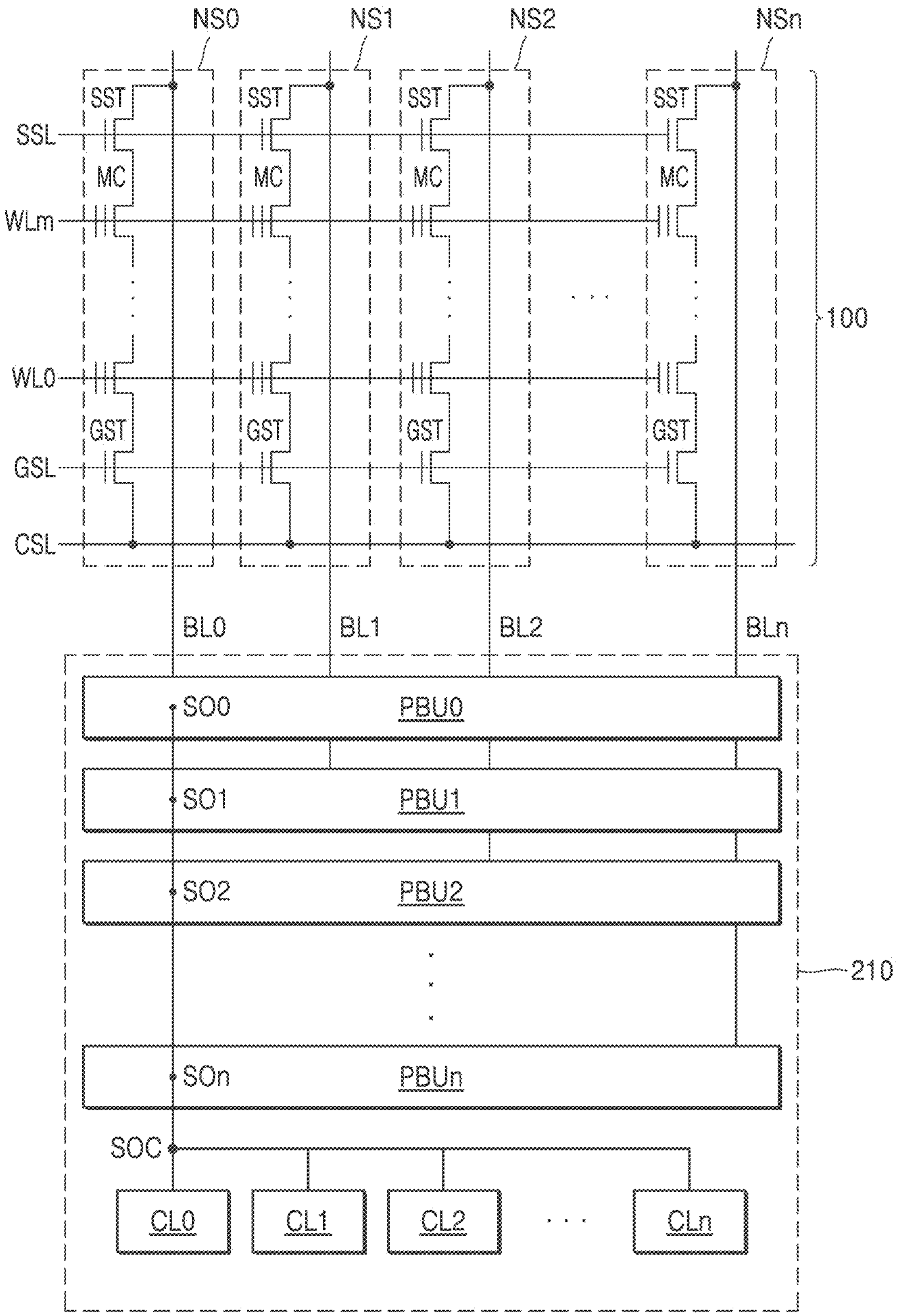
FIG. 5 is a diagram illustrating a connection between a memory cell array and a page buffer circuit, according to some example embodiments.

FIG. 5 is a diagram illustrating a connection between a memory cell array 100 and a page buffer circuit 210, according to some example embodiments.

Referring to FIG. 5, the memory cell array 100 may include first to $n^{th}$+1 NAND strings NS0 to NSn, each of the first to $n^{th}$+1 NAND strings NS0 to NSn may include a ground selection transistor GST connected to a ground selection line GSL, a plurality of memory cells MC respectively connected to a plurality of word lines WL0 to WLm, and a string selection transistor SST connected to the string selection line SSL, and the ground selection transistor GST, the plurality of memory cells MC, and the string selection transistor SST may be serially connected to one another. Here, m may be a positive integer.

The page buffer circuit 210 may include first to $n^{th}$+1 page buffer units PBU0 to PBUn. The first page buffer unit PBU0 may be connected to the first NAND string NS0 through a first bit line BL0, and the $n^{th}$+1 page buffer unit PBUn may be connected to the $n^{th}$+1 NAND string NSn through an $n^{th}$+1 bit line BLn. Here, n may be a positive integer. For example, n may be 7, and the page buffer circuits 210 may have a structure where eight page buffer units PBU0 to PBUn are arranged in one row. For example, the first to $n^{th}$+1 page buffer units PBU0 to PBUn may be arranged in one row in an extension direction of each of first to $n^{th}$+1 bit lines BL0 to BLn.

The page buffer circuit 210 may further include first to $n^{th}$+1 cache latches CL0 to CLn respectively corresponding to the first to $n^{th}$+1 page buffer units PBU0 to PBUn. For example, n may be 7, and the page buffer circuits 210 may have a structure where eight cache lines CL0 to CLn are arranged in one row. For example, the first to $n^{th}$+1 cache latches CL0 to CLn may be arranged in one row in the extension direction of each of the first to $n^{th}$+1 bit lines BL0 to BLn.

The sensing nodes SO0 to SOn of the first to $n^{th}$+1 page buffer units PBU0 to PBUn may be connected to a coupling sensing node SOC in common. Also, the first to $n^{th}$+1 cache latches CL0 to CLn may be connected to the coupling sensing node SOC in common. Therefore, the first to $n^{th}$+1 page buffer units PBU0 to PBUn may be connected to the first to $n^{th}$+1 cache latches CL0 to CLn through the coupling sensing node SOC. Although not shown, the first to $n^{th}$+1 page buffer units PBU0 to PBUn may include at least one selection transistor which electrically connects the sensing nodes SO0 to SOn with each other.

Figure 6:
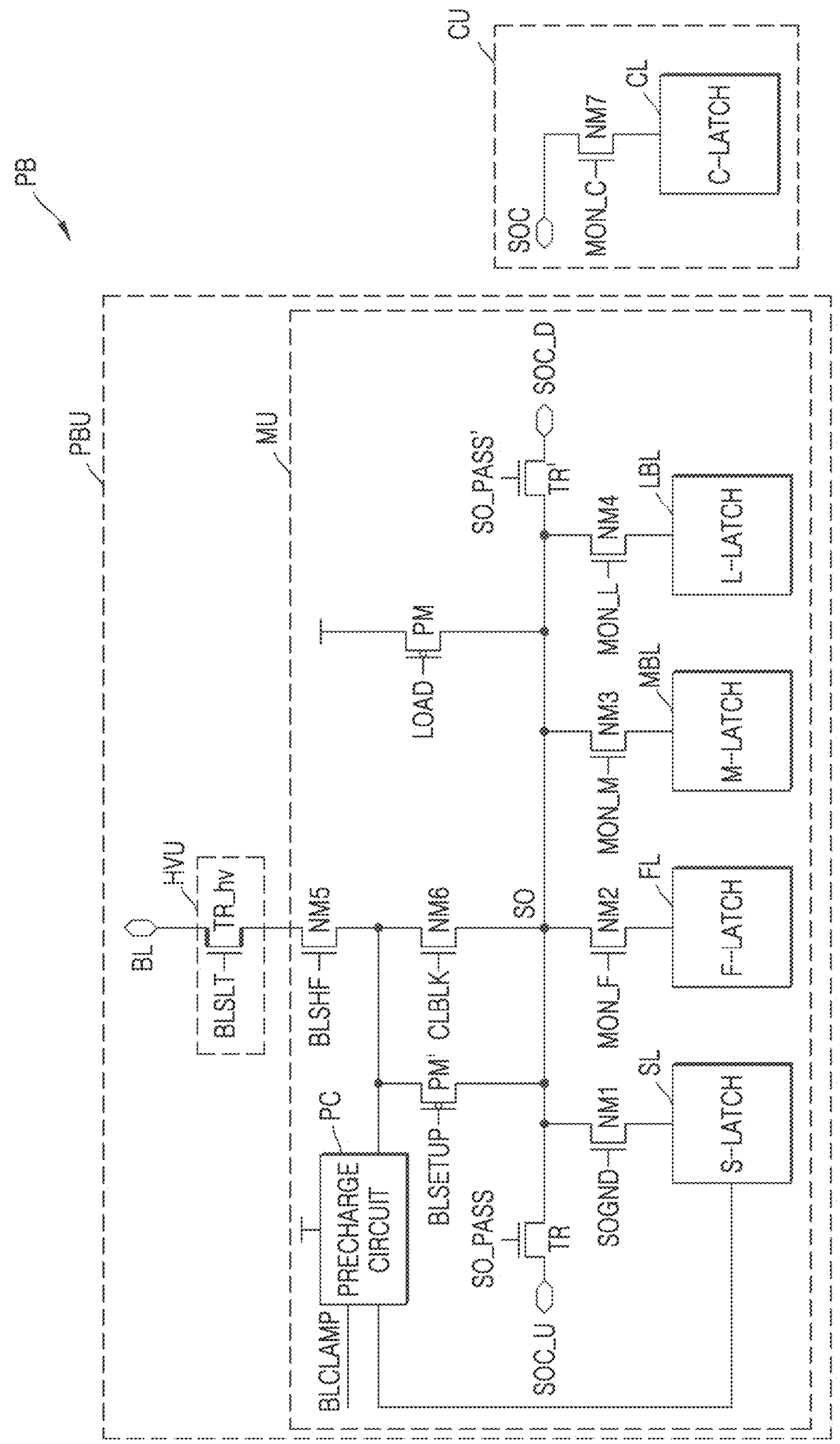
FIG. 6 is a diagram illustrating in detail a page buffer according to some example embodiments.

FIG. 6 is a diagram illustrating in detail a page buffer PB according to some example embodiments.

Referring to FIG. 6, the page buffer PB may correspond to an example of the page buffer PB of FIG. 1. The page buffer PB may include a page buffer unit PBU and a cache unit CU. The cache unit CU may include a cache latch (C-LATCH) CL and the cache latch CL may be connected to a data I/O line, and thus, the cache unit CU may be disposed adjacent to the data I/O line. Accordingly, the page buffer unit PBU and the cache unit CU may be disposed apart from each other, and the page buffer PB may have a separation structure of page buffer unit PBU-cache unit CU.

The page buffer unit PBU may include a main unit MU. The main unit MU may include main transistors in the page buffer PB. The page buffer unit PBU may further include a bit line selection transistor TR_hv which is connected to a bit line BL and is driven by a bit line selection signal BLSLT. The bit line selection transistor TR_hv may be implemented as a high voltage transistor, and thus, the bit line selection transistor TR_hv may be disposed in a well region which differs from the main unit MU, namely, may be disposed in a high voltage unit HVU.

The main unit MU may include a sensing latch (S-LATCH) SL, a force latch (F-LATCH) FL, an upper bit latch (M-LATCH) MBL, and a lower bit latch (L-LATCH) LBL. According to some example embodiments, the sensing latch SL, the force latch FL, the upper bit latch MBL, or the lower bit latch LBL may be referred to as a main latch. The main unit MU may further include a precharge circuit PC for controlling a precharge operation on the bit line BL or the sensing node SO, based on a bit line clamping control signal BLCLAMP and may further include a transistor PM' which is driven by a bit line setup signal BLSETUP.

The sensing latch SL may store data stored in a memory cell or a sensing result of a threshold voltage of the memory cell, in a read or program verify operation. Also, the sensing latch SL may be used to apply a program bit line voltage or a program inhibit voltage to the bit line BL in a program operation. The force latch FL may be used for improving a threshold voltage distribution in a program operation. In detail, the force latch FL may store force data. The force data may be initially set to '1', and then, may be inverted into 'O' when a threshold voltage of a memory cell enters a forcing region which does not reach a target region. By using the force data, a bit line voltage may be controlled when performing a program execute operation, and a program threshold voltage distribution may be more narrowly formed.

The upper bit latch MBL, the lower bit latch LBL, and a cache latch CL may be used for storing data input from the outside in a program operation and may be referred to as a data latch. In a case where data of 3 bits are programmed in one memory cell, data of 3 bits may be respectively stored in the upper bit latch MBL, the lower bit latch LBL, and the cache latch CL. The upper bit latch MBL, the lower bit latch LBL, and the cache latch CL may maintain stored data until programming of a memory cell is completed. Also, the cache latch CL may output data, which is read from a memory cell and is transferred from the sensing latch SL in a read operation, to the outside through a data I/O line.

Also, the main unit MU may further include first to fourth transistors NM1 to NM4. The first transistor NM1 may be connected between the sensing node SO and the sensing latch SL and may be driven by a ground control signal SOGND. The second transistor NM2 may be connected between the sensing node SO and the force latch FL and may be driven by a forcing monitoring signal MON_F. The third transistor NM3 may be connected between the sensing node SO and the upper bit latch MBL and may be driven by an upper bit monitoring signal MON_M. The fourth transistor NM4 may be connected between the sensing node SO and the lower bit latch LBL and may be driven by a lower bit monitoring signal MON_L.

Also, the main unit MU may further include fifth and sixth transistors NM5 and NM6 which are serially connected between the sensing node SO and the bit line selection transistor TR_hv. The fifth transistor NM5 may be driven by a bit line shut-off signal BLSHF, and the sixth transistor NM6 may be driven by a bit line connection control signal CLBLK. Also, the main unit MU may further include a precharge transistor PM. The precharge transistor PM may be connected to the sensing node SO, may be driven by a load signal LOAD, and may precharge the sensing node SO at a precharge level in a precharge period.

In some example embodiments, the main unit MU may further include a pair of pass transistors (for example, first and second pass transistors) TR and TR' connected to the sensing node SO. According to some example embodiments, the first and second pass transistors TR and TR' may be referred to as first and second sensing node connection transistors. The first and second pass transistors TR and TR' may be driven based on first and second pass control signals SO_PASS and SO_PASS'. According to some example embodiments, the first and second pass control signals SO_PASS and SO_PASS' may be referred to as first and second sensing node connection control signals. In detail, the first pass transistor TR may be connected between a first terminal SOC_U and the sensing node SO, and the second pass transistor TR' may be connected between a second terminal SOC_D and the sensing node SO.

For example, when the page buffer unit PBU is the second page buffer unit PBU1 of FIG. 5, the sensing node SO may be a second sensing node SO1. The first terminal SOC_U may be connected to one end of a pass transistor included in the first page buffer unit PBU0, and the second terminal SOC_D may be connected to one end of a pass transistor included in the third page buffer unit PBU3. Therefore, the sensing node SO may be electrically connected to the coupling sensing node SOC through pass transistors respectively included in the third to $n^{th}+1$ page buffer units PBU2 to PBUn.

In some example embodiments, one of the first and second pass transistors TR and TR' may be omitted.

The page buffer PB may verify whether programming of a selected memory cell of memory cells included in a NAND string connected to a bit line BL is completed, in a program operation. In detail, the page buffer PB may store data, sensed through the bit line BL, in the sensing latch SL in a program verify operation. The upper bit latch MBL and the lower bit latch LBL each storing target data may be set based on the sensed data stored in the sensing latch SL. For example, when the sensed data represents the completion of programming, the upper bit latch MBL and the lower bit latch LBL may be changed to a program inhibit setting on a selected memory cell in a next program loop. The cache latch CL may temporarily store input data provided from the outside. In a program operation, the target data stored in the cache latch CL may be stored in the upper bit latch MBL and the lower bit latch LBL.

Figure 7:
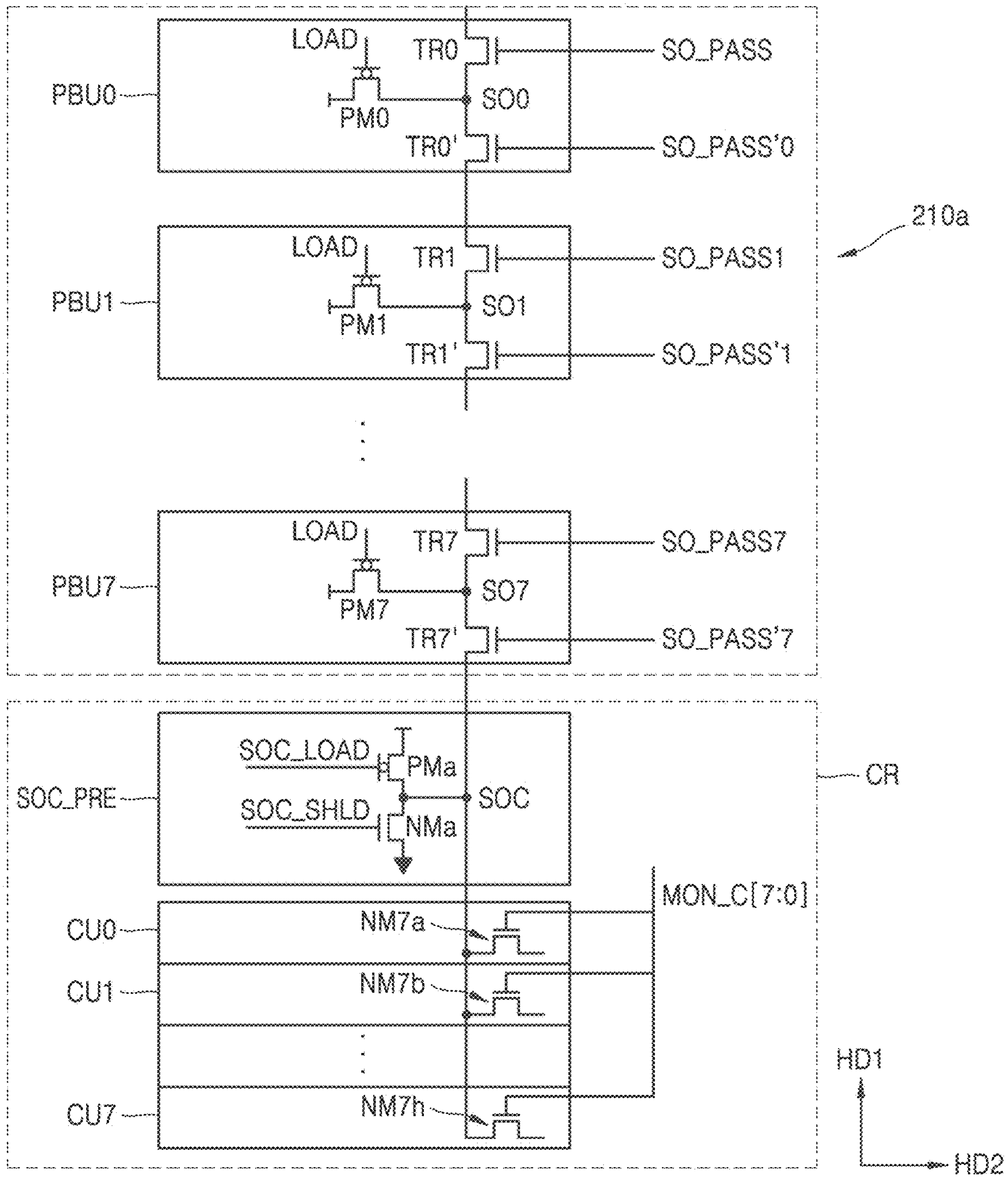
FIG. 7 is a circuit diagram illustrating a page buffer circuit according to some example embodiments.

FIG. 7 is a circuit diagram illustrating a page buffer circuit 210*a* according to some example embodiments.

In FIG. 7, each of first to eighth page buffer units PBU0 to PBU7 may include two pass transistors. Therefore, the page buffer circuit 210*a* may include sixteen pass transistors TR0, TR0' to TR7, and TR7', and the sixteen pass transistors TR0, TR0' to TR7, and TR7' may be serially connected to one another. For example, the first page buffer unit PBU0 may include first and second pass transistors TR0 and TR0' serially connected to each other. For example, the first and second pass transistors TR0 and TR0' may be implemented as NMOS transistors, but the inventive concepts are not limited thereto.

For example, the first page buffer unit PBU0 may further include a plurality of transistors (for example, transistors (e.g., first to sixth transistors NM1 to NM6) included in the sensing latch SL, the force latch FL, the upper bit latch MBL, and the lower bit latch LBL of FIG. 6) which are arranged in a first horizontal direction HD1, between the first and second pass transistors TR0 and TR0'. Hereinafter, a configuration of the first page buffer unit PBU0 will be mainly described, and each of the second to eighth page buffer units PBU1 to PBU7 may be configured to be substantially equal or equal to the first page buffer unit PBU0.

A source of the first pass transistor TR0 may be connected to a first terminal (for example, SOC_U of FIG. 6), and a drain of the first pass transistor TR0 may be connected to a first sensing node SO0. A pass control signal SO_PASS0 may be applied to a gate of the first pass transistor TR0.

A source of the second pass transistor TR0' may be connected to the first sensing node SO0, and a drain of the second pass transistor TR0' may be connected to a second terminal (for example, SOC_D of FIG. 6). A pass control signal SO_PASS'0 may be applied to a gate of the second pass transistor TR0'.

The second page buffer unit PBU1 may include first and second pass transistors TR1 and TR1' serially connected to each other. Pass control signals SO_PASS1 and SO_PASS'1 may be applied to gates of the first and second pass transistors TR and TR'.

The eighth page buffer unit PBU7 may include first and second pass transistors TR7 and TR7' serially connected to each other. Pass control signals SO_PASS7 and SO_PASS'7 may be applied to gates of the first and second pass transistors TR7 and TR7'.

As illustrated in FIG. 7, different pass control signals may be applied to gates of two pass transistors included in one page buffer unit. However, the inventive concepts are not limited thereto, and in some example embodiments, the same pass control signal may be applied to gates of pass transistors (for example, TR0' and TR1') disposed between adjacent sensing nodes (for example, SO0 and SO1). That is, because pass control signals having the same level may be applied to the gates of the pass transistors (for example, TR0' and TR1') disposed between the adjacent sensing nodes (for example, SO0 and SO1), the adjacent sensing nodes (for example, SO0 and SO1) may be selectively connected to each other.

A first cache unit CU0 may include a monitor transistor NM7*a*. For example, the monitor transistor NM7*a* may correspond to the transistor NM7 of FIG. 6. A source of the monitor transistor NM7*a* may be connected to a coupling sensing node SOC, and a cache monitoring signal MON_C [7:0] may be applied to a gate of the monitor transistor NM7*a*. Although not shown, the first cache unit CU0 may further include a plurality of transistors (for example, a plurality of transistors included in the cache latch CL of FIG. 6) arranged in a first horizontal direction HD1. Each of second to eighth cache units CU1 to CU7 may have substantially the same or the same configuration as that of the first cache unit CU0. Monitor transistors NM7*a* to NM7*h* respectively included in the first to eighth cache units CU0 to CU7 may be connected to the coupling sensing node SOC in common. In detail, a source of each of the monitor transistors NM7*a* to NM7*h* may be connected to the coupling sensing node SOC in common.

According to some example embodiments, when first and second pass control signals SO_PASS0 to SO_PASS7 and SO_PASS'0 to SO_PASS'7 are activated, first and second pass transistors TR0 to TR7 and TR0' to TR7' may be turned on. Accordingly, the first and second pass transistors TR0 to TR7' respectively included in the first to eighth page buffer units PBU0 to PBU7 may be serially connected to one another, and all of first to eighth sensing nodes SO0 to SO7 may be electrically connected to the coupling sensing node SOC.

The first to eighth page buffer units PBU0 to PBU7 may further include precharge transistors PM0 to PM7. In the first page buffer unit PBU0, the precharge transistor PM0 may include a gate which is connected between the first sensing node SO0 and a voltage terminal, to which a precharge level (for example, VDD) is applied, and receives a load signal LOAD. The precharge transistor PM0 may precharge the first sensing node SO0 at the precharge level in response to the load signal LOAD.

The page buffer circuit 210*a* may further include a precharge circuit SOC_PRE between the eighth page buffer unit PBU7 and the first cache unit CU0. The precharge circuit SOC_PRE may include a shielding transistor NMa and a precharge transistor PMa for precharging the coupling sensing node SOC. The precharge transistor PMa may be driven by a coupling sensing node load signal SOC_LOAD, and when the precharge transistor PMa is turned on, the coupling sensing node SOC may be precharged at the precharge level (for example, VDD). The shielding transistor NMa may be driven by a coupling sensing node shielding signal SOC_SHLD, and when the shielding transistor NMa is turned on, the coupling sensing node SOC may be discharged at a ground level.

In a structure where the first to eighth page buffer units PBU0 to PBU7 are separated from the first to eighth cache units CU0 to CU7, in a case where eight paths are formed for respectively connecting the first to eighth page buffer units PBU0 to PBU7 to the first to eighth cache units CU0 to CU7, the size of the page buffer circuit 210*a* may increase due to wirings which respectively form the eight paths.

However, according to some example embodiments, the first to eighth sensing nodes SO0 to SO7 may be connected to one another by using the first and second pass transistors TR0 to TR7 and TR0' to TR7' respectively included in the first to eighth page buffer units PBU0 to PBU7, and the first to eighth sensing nodes SO0 to SO7 may be connected to the first to eighth cache units CU0 to CU7 through the coupling sensing node SOC. That is, the page buffer circuit 210*a* may have a structure where the first to eighth sensing nodes SO0 to SO7 are connected to one another when the first and second pass transistors TR0 to TR7 and TR0' to TR7' are turned on, and thus, may connect the first to eighth page buffer units PBU0 to PBU7 to the first to eighth cache units CU0 to CU7 through one path. That is, because the first to eighth page buffer units PBU0 to PBU7 are connected to the first to eighth sensing nodes SO0 to SO7 through one path, the size of the page buffer circuit 210*a* may be reduced.

The first to eighth page buffer units PBU0 to PBU7 may be disposed in a main region MR, the first to eighth cache units CU0 to CU7 may be disposed in a cache region CR, and the main region MR may be adjacent to the cache region CR in the first horizontal direction HD1.

Figure 8:
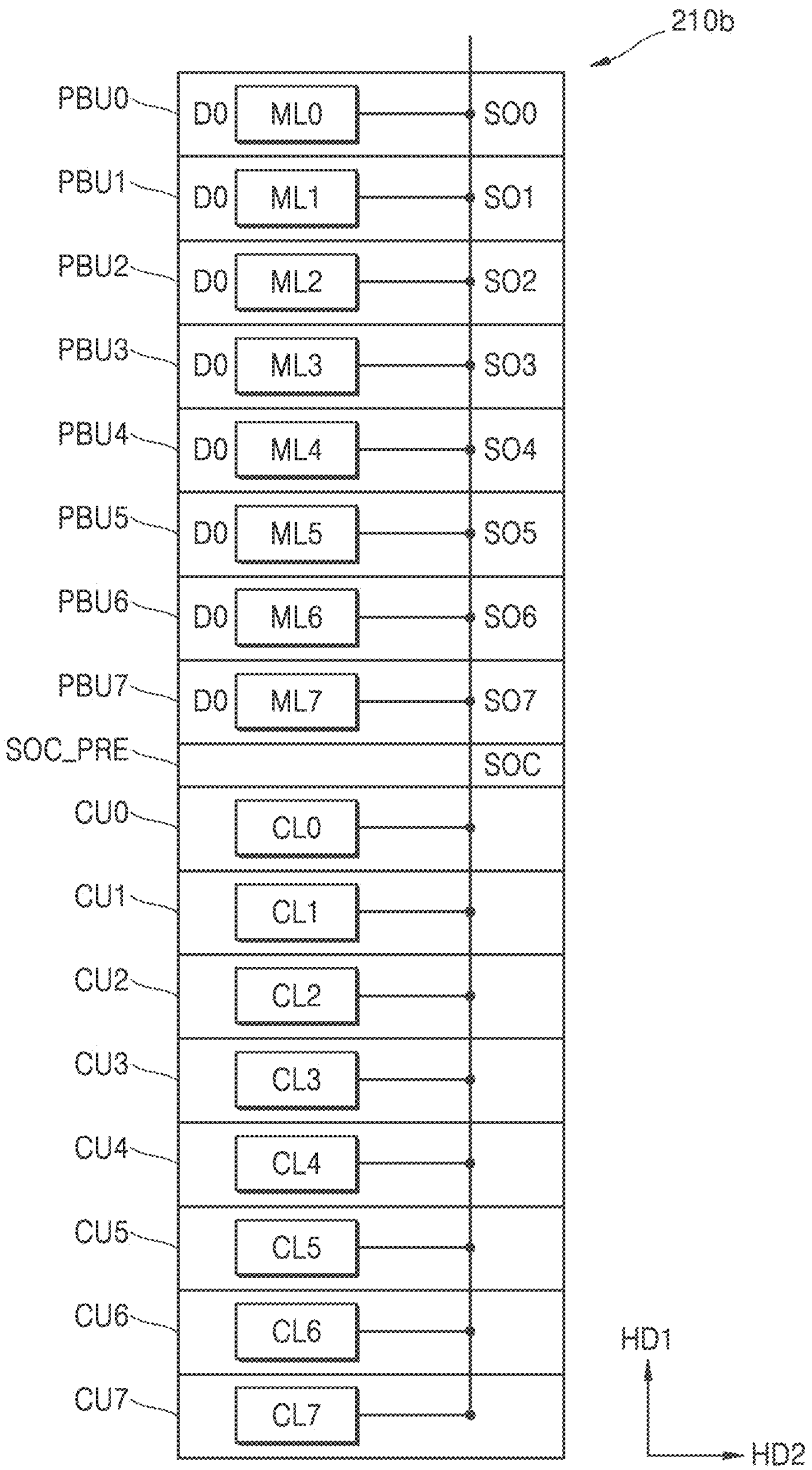
FIG. 8 is a diagram describing data stored in a page buffer circuit according to some example embodiments.

FIG. 8 is a diagram describing data stored in a page buffer circuit 210*b* according to some example embodiments.

Referring to FIG. 8, the page buffer circuit 210*b* may have the same structure as that of the page buffer circuit 210*a* of FIG. 7.

First to eighth page buffer units PBU0 to PBU7 included in the page buffer circuit 210*b* may respectively include first to eighth main latches ML0 to ML7. Each of the first to eighth main latches ML0 to ML7 may correspond to one of the sensing latch SL, the force latch FL, the upper bit latch MBL, and the lower bit latch LBL of FIG. 6.

When a sensing operation is completed, the first to eighth main latches ML0 to ML7 may store first to eighth data D0 to D7. In detail, referring to FIG. 5, the first to eighth data D0 to D7 may represent the turn-on/off of a selected memory cell included in first to eighth NAND strings NS0 to NS7 through first to eighth bit lines BL0 to BL8. For example, when a selected memory cell included in the first NAND string NS0 is an on cell, the first data D0 may be '1', and when the selected memory cell included in the first NAND string NS0 is an off cell, the first data D0 may be '0'. However, some example embodiments is not limited thereto.

Figure 9:
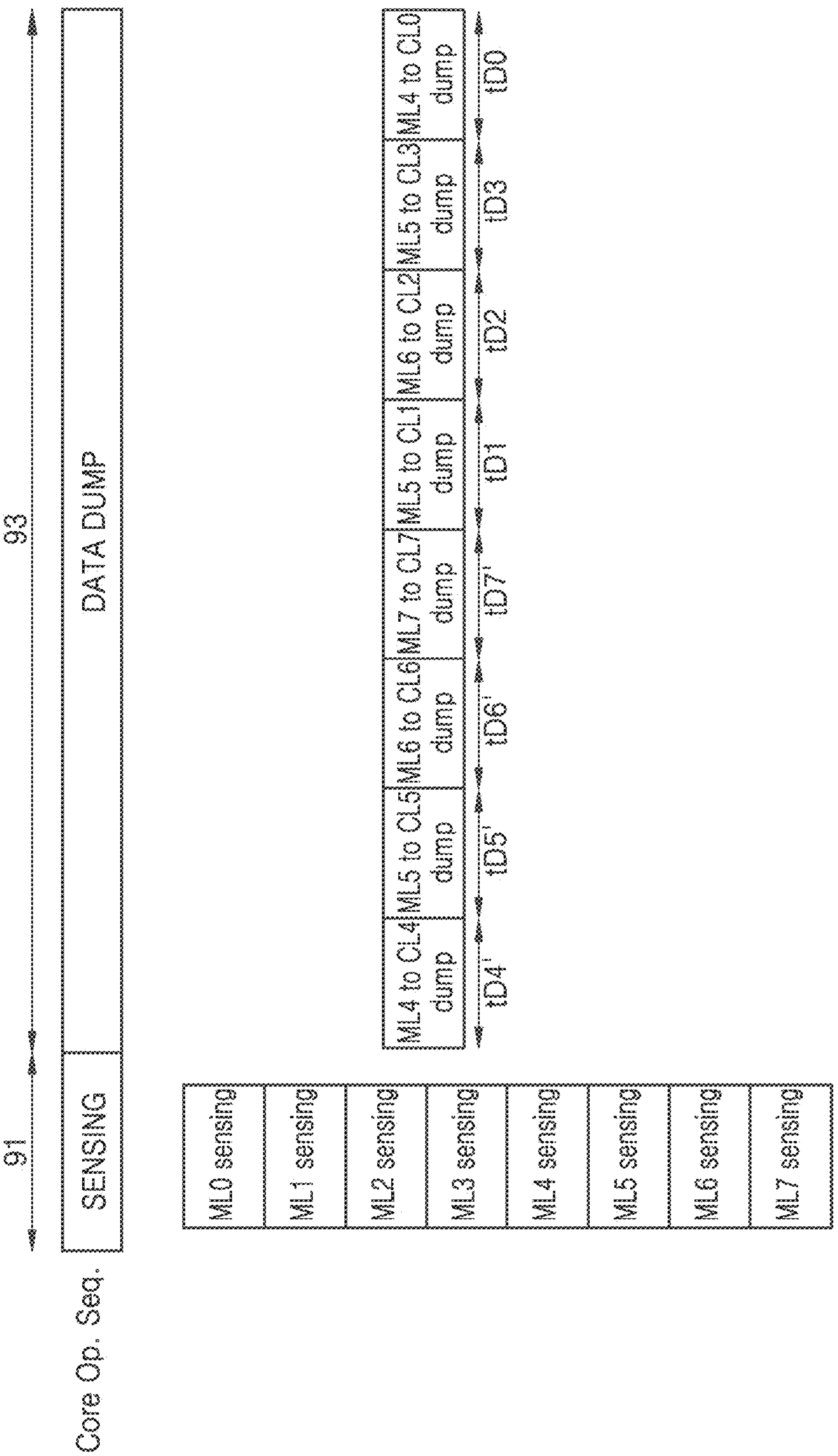
FIG. 9 is a diagram describing a core operation sequence according to a comparative example.

FIG. 9 is a diagram to describe a core operation sequence according to a comparative example. FIG. 9 may be described with reference to FIG. 8.

Referring to FIG. 9, the core operation sequence may include a data sensing period 91 where a data sensing operation is performed and a data dump period 92 where a data dumping operation is performed. The data dump period 92 may be referred to as a data transfer period.

In the data sensing period 91, first to eighth page buffer units PBU0 to PBU7 may not be connected to a coupling sensing node SOC. In other words, the first to eighth page buffer units PBU0 to PBU7 may not be electrically connected to first to eighth cache units CU0 to CU7. Also, each of the first to eighth page buffer units PBU0 to PBU7 may not be electrically connected to an adjacent page buffer unit. Accordingly, first to eighth sensing nodes SO0 to SO7 may be individually developed, and different data may be stored in first to eighth main latches ML0 to ML7, based on whether a corresponding memory cell is an on cell or an off cell.

In the data sensing period 91, the first to eighth sensing nodes SO0 to SO7 may be electrically disconnected from one another. The first to eighth page buffer units PBU0 to PBU7 may determine whether a memory cell is an on cell or an off cell, based on levels of the first to eighth sensing nodes SO0 to SO7, and may store a determination result in the first to eighth main latches ML0 to ML7. In detail, the data sensing period 91 may include a precharge period where an operation of precharging voltages of first to eighth bit lines BL0 to BL7 or voltages of the first to eighth sensing nodes SO0 to SO7 at a precharge level is performed, a develop period where an operation of electrically connecting the first to eighth bit lines BL0 to BL7 to the first to eighth sensing nodes SO0 to SO7 to develop the voltages of the first to eighth sensing nodes SO0 to SO7 is performed, and a sensing period where an operation of sensing the voltages of the first to eighth sensing nodes SO0 to SO7 is performed. Data sensed in the sensing period may be stored in the first to eighth main latches ML0 to ML7.

In the data dump period 92, the data stored in the first to eighth main latches ML0 to ML7 may be transferred to first to eighth cache latches CL0 to CL7.

In the data dump period 92, the first to eighth main latches ML0 to ML7 may sequentially transfer data to the first to eighth cache latches CL0 to CL7. Referring to FIG. 9, data stored in the fifth to eighth main latches ML4 to ML7 may be preferentially transferred to the fifth to eighth cache latches CL4 to CL7, and data stored in the first to fourth main latches ML0 to ML3 may be transferred to the first to fourth cache latches CL0 to CL3. However, some example embodiments is not limited thereto, and an order in which the first to eighth main latches ML0 to ML7 transfer data to the first to eighth cache latches CL0 to CL7 may be changed.

In the data dump period 92, a sensing node connected to a main latch performing a data dump operation may be electrically connected to the coupling sensing node SOC. In other words, a page buffer unit including the main latch performing the data dump operation may be electrically connected to a cache unit. Also, a corresponding page buffer unit may be electrically connected to page buffer units disposed between the cache unit and the corresponding page buffer unit. A sensing node of the corresponding page buffer unit may be electrically connected to sensing nodes disposed between the coupling sensing node SOC and the sensing node of the corresponding page buffer unit.

In FIG. 9, the data dump period 92 may include first to eighth time periods tD0' to tD7'. The first to eighth time periods tD0' to tD7' may respectively correspond to times for which pieces of data are transferred from the first to eighth main latches ML0 to ML7 to the first to eighth cache latches CL0 to CL7.

In FIG. 9, a distance between the coupling sensing node SOC and each of the first to fourth sensing nodes SO0 to SO3 may be longer than a distance between the coupling sensing node SOC and each of the fifth to eighth sensing nodes SO4 to SO7. Therefore, a time for which the coupling sensing node SOC is developed for transferring data of the first to fourth main latches ML0 to ML3 to the first to fourth cache latches CL0 to CL3 may be longer than a time for which the coupling sensing node SOC is developed for transferring data of the fifth to eighth main latches ML4 to ML7 to the fifth to eighth cache latches CL4 to CL7.

Figure 10:
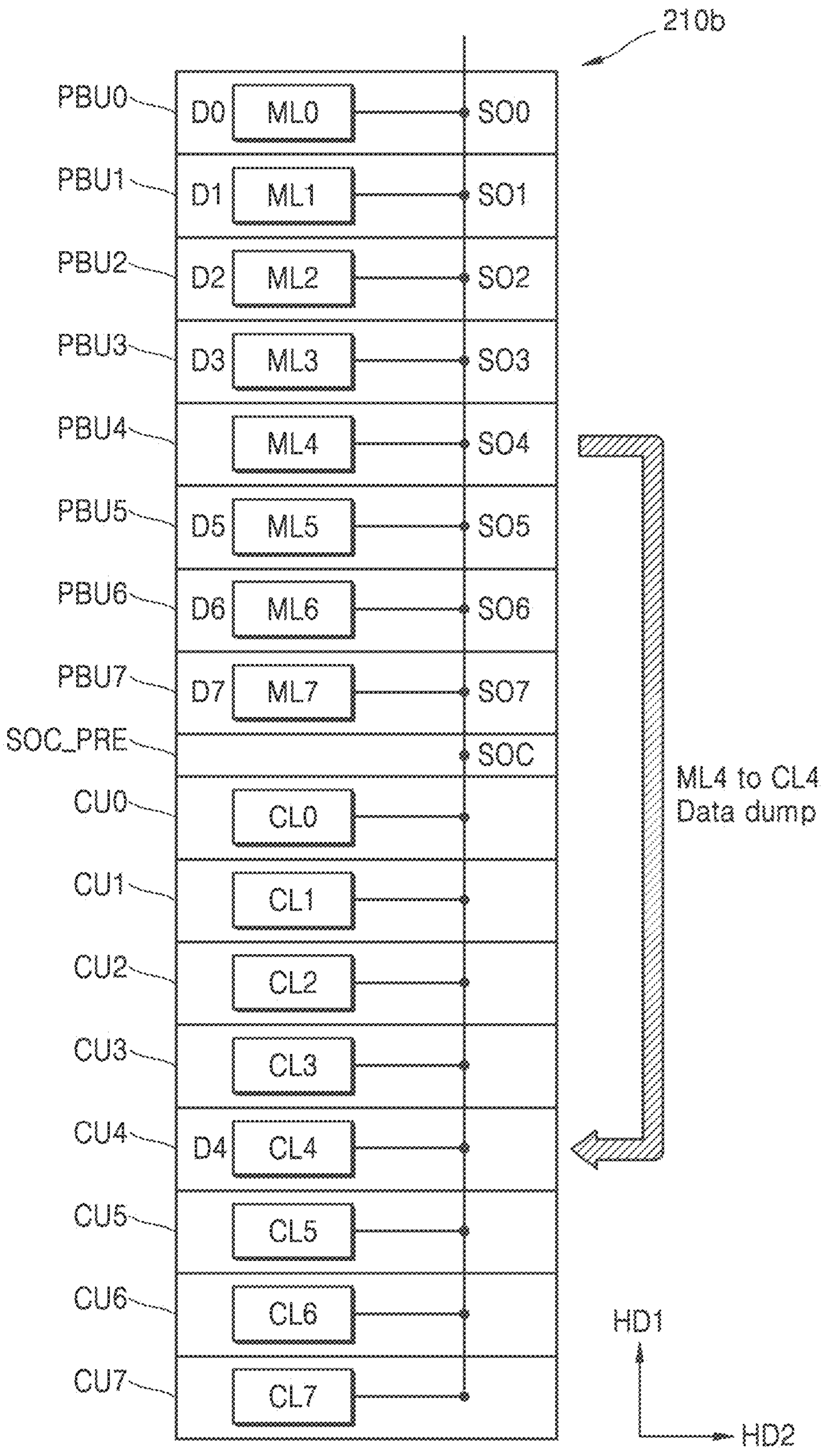
FIGS. 10 to 12 are diagrams describing a data dump operation according to some example embodiments.
Figure 11:
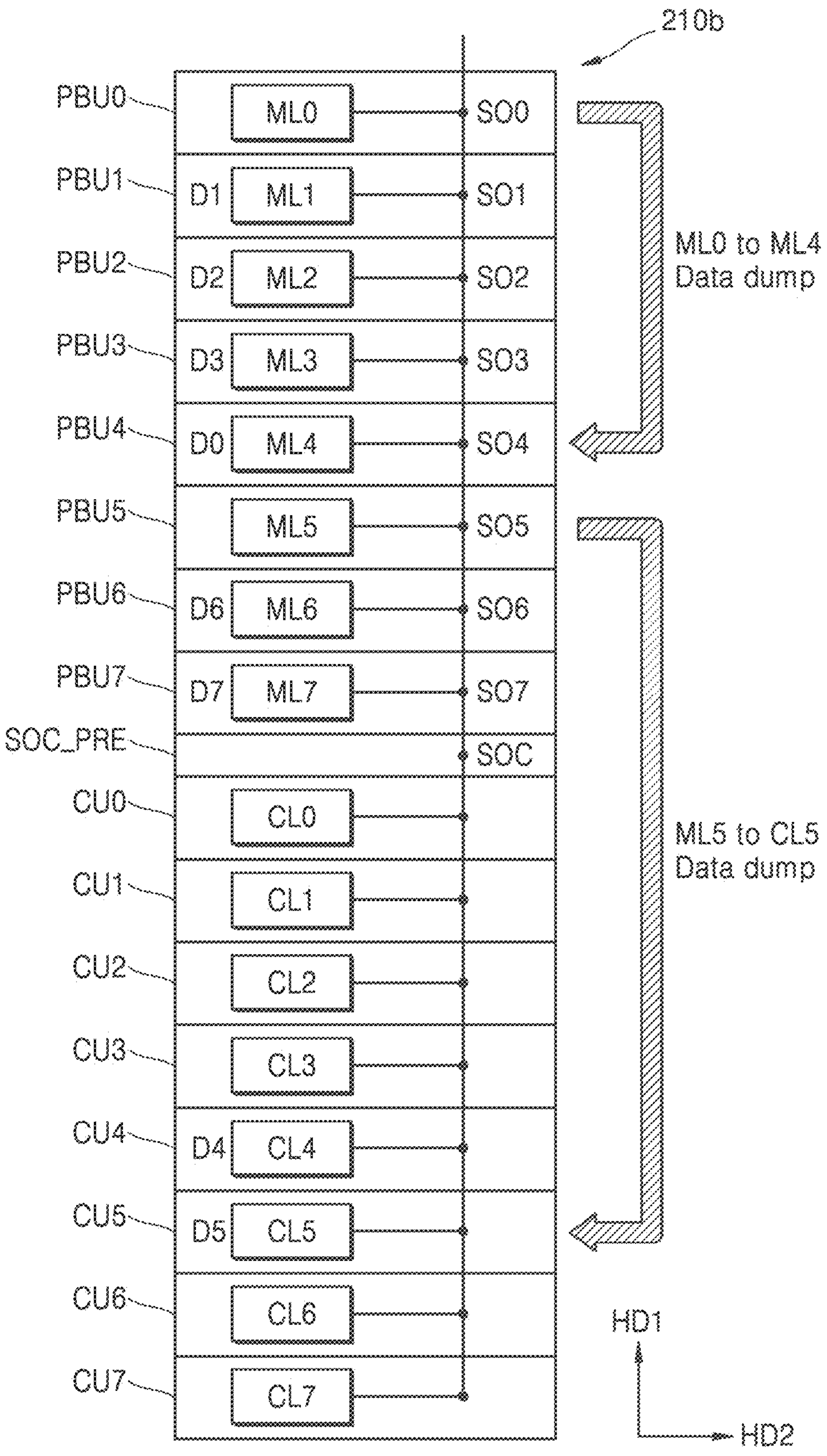
Figure 12:
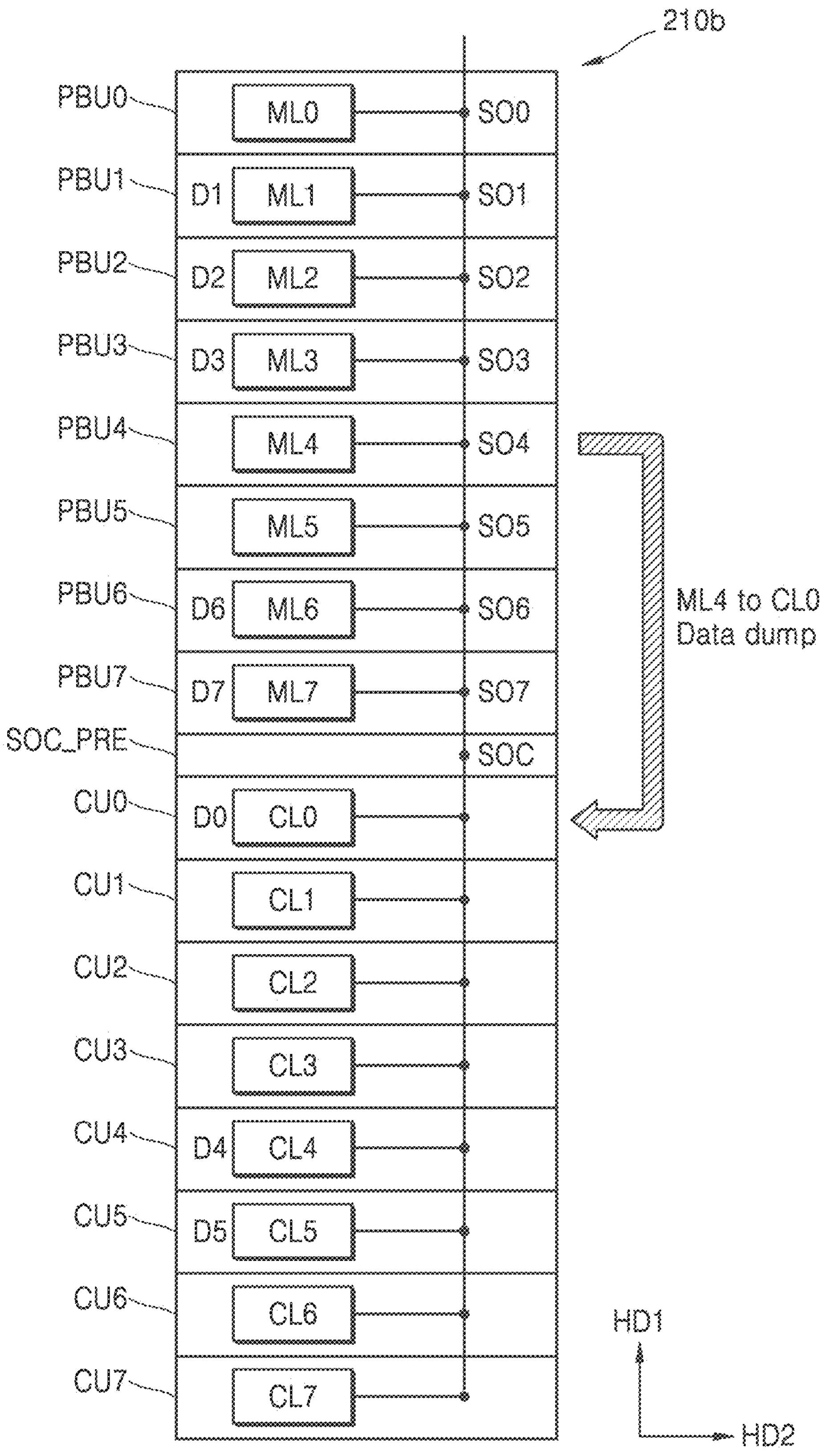
Figure 13:
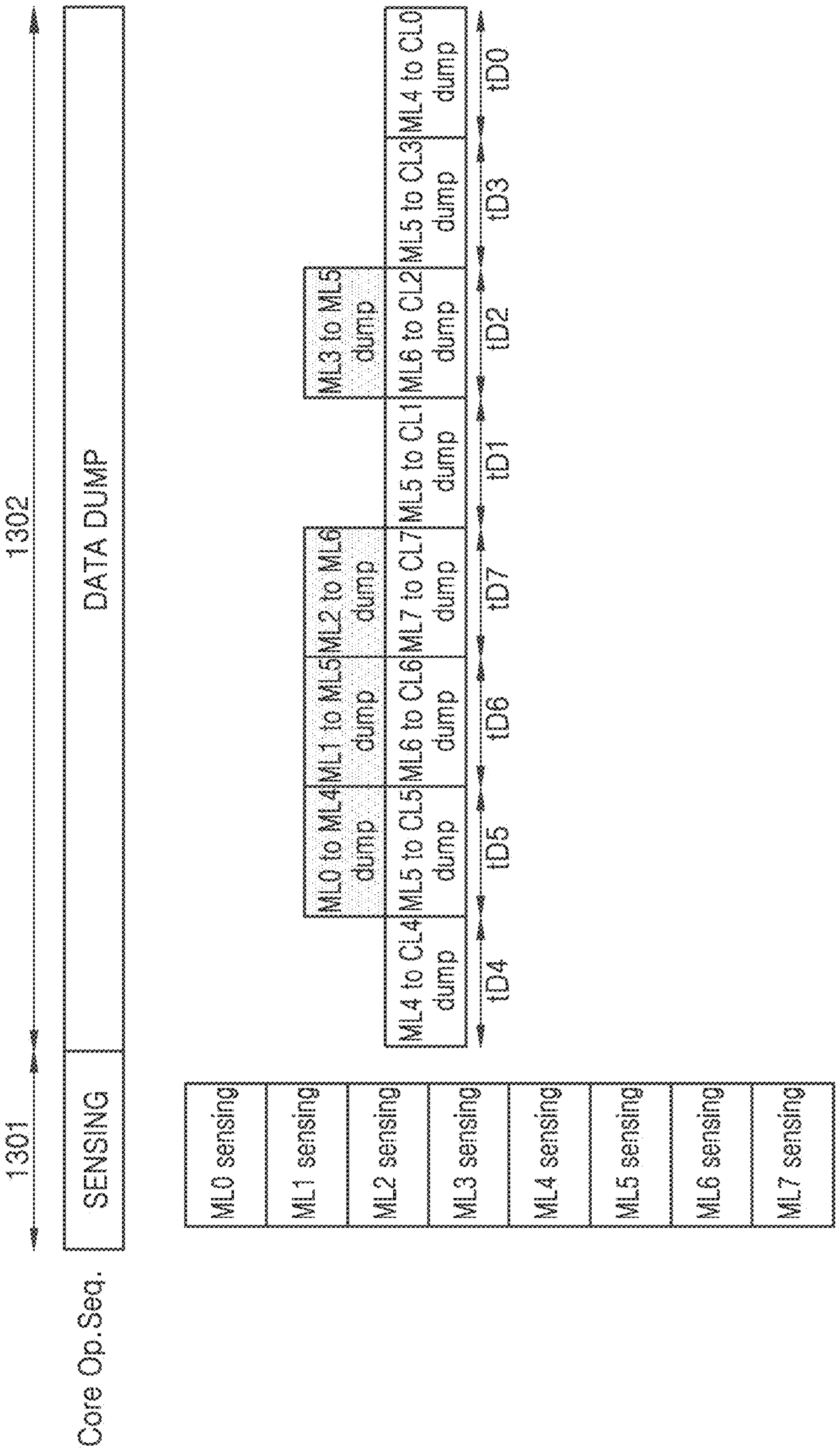
FIG. 13 is a diagram describing a core operation sequence according to some example embodiments.

FIGS. 10 to 12 are diagrams to describe a data dump operation according to some example embodiments. FIG. 13 is a diagram to describe a core operation sequence according to some example embodiments.

Herein, a data dump operation of transferring data from a main latch to another main latch may be referred to as a first data dump operation, and a data dump operation of transferring data from a main latch to a cache latch may be referred to as a second data dump operation.

Referring to FIG. 10, in one time period (for example, tD4 of FIG. 13) of a data dump operation, a fifth main latch ML4 connected to a fifth sensing node SO4 may transfer fifth data D4 to a fifth cache latch CL4. That is, in FIG. 10, a second data dump operation between the fifth main latch ML4 and the fifth cache latch CL4 may be performed.

Referring to FIG. 11, in another time period (for example, tD5 of FIG. 13), a first main latch ML0 may transfer first data D0 to the fifth main latch ML4. A distance between a first sensing node SO0 and a coupling sensing node SOC may be greater than a distance between the fifth sensing node SO4 and the coupling sensing node SOC. In other words, a distance between a fifth page buffer unit PBU4 and the coupling sensing node SOC may be greater than a distance between a first page buffer unit PBU0 and the coupling sensing node SOC. In a corresponding time period, a sixth main latch ML5 may transfer sixth data D5 to a sixth cache latch CL5. In other words, in a corresponding time period, a first data dump operation between the first main latch ML0 and the fifth main latch ML4 and a second data dump operation between the sixth main latch ML5 and the sixth cache latch CL5 may be performed in parallel.

Referring to FIG. 12, in another time period (for example, tD0 of FIG. 13), the fifth main latch ML4 may transfer the first data D0 to the first cache latch CL0. In other words, in a corresponding time period, a second data dump operation between the fifth main latch ML4 and the first cache latch CL0 may be performed.

A distance between the fifth sensing node SO4 and the coupling sensing node SOC may be less than a distance between the first sensing node SO0 and the coupling sensing node SOC. In other words, a distance between the fifth page buffer unit PBU4 and the coupling sensing node SOC may be less than a distance between the first page buffer unit PBU0 and the coupling sensing node SOC. Accordingly, in a state where the fifth sensing node SO4 is connected to the coupling sensing node SOC, a capacitance of the coupling sensing node SOC may be relatively less, and a develop time may be relatively shorter.

Referring to FIG. 13, the core operation sequence may include a data sensing period 1301 and a data dump period 1302. The data sensing period 1301 may correspond to the data sensing period 91 of FIG. 9. The data dump period 1302 may include first to eighth time periods tD0 to tD7. In the first to eighth time periods tD0 to tD7, first to eighth data D0 to D7 may be respectively transferred to first to eighth cache latches CL0 to CL7.

Unlike the sixth time period tD5' of FIG. 9, in a sixth time period of tD5 of FIG. 13, a first data dump operation between the first main latch ML0 and the fifth main latch ML4 and a second data dump operation between the sixth main latch ML5 and the sixth cache latch CL5 may be performed in parallel.

Unlike the seventh time period tD6' of FIG. 9, in a seventh time period of tD6 of FIG. 13, a first data dump operation between the second main latch ML1 and the sixth main latch ML5 and a second data dump operation between the seventh main latch ML6 and the seventh cache latch CL6 may be performed in parallel.

In a second time period of tD1 of FIG. 13, a second data dump operation between the sixth main latch ML5 and the third cache latch CL2 may be performed. A distance between the sixth sensing node SO5 and the coupling sensing node SOC may be less than a distance between the second sensing node SO1 and the coupling sensing node SOC, and thus, the second time period of tD1 of FIG. 13 may be less than the second time period tD1' of FIG. 9.

Unlike the third time period tD2' of FIG. 9, in a third time period of tD2 of FIG. 13, a first data dump operation between the fourth main latch ML3 and the sixth main latch ML5 and a second data dump operation between the seventh main latch ML6 and the third cache latch CL2 may be performed in parallel.

Unlike the fourth time period tD3' of FIG. 9, in a fourth time period of tD3 of FIG. 13, a second data dump operation between the sixth main latch ML5 and the fourth cache latch CL3 may be performed. A distance between the sixth sensing node SO5 and the coupling sensing node SOC may be less than a distance between the fourth sensing node SO3 and the coupling sensing node SOC, and thus, the fourth time period of tD3 of FIG. 13 may be less than the fourth time period tD3' of FIG. 9.

In a first time period tD0, a second data dump operation between the fifth main latch ML4 and the first cache latch CL0 may be performed. A distance between the fifth sensing node SO4 and the coupling sensing node SOC may be less than a distance between the first sensing node SO0 and the coupling sensing node SOC, and thus, the first time period of tD0 of FIG. 13 may be less than the first time period tD0' of FIG. 9.

According to some example embodiments, the page buffer circuit 210*b* may previously transfer data from a main latch, which is relatively farther away from the coupling sensing node SOC, to a main latch close to the coupling sensing node SOC while a data dump operation between a main latch and a cache latch is being performed, and thus, a read time for reading the first to eighth data D0 to D7 may be reduced.

Therefore, the improved devices and methods overcome the deficiencies of the conventional devices and methods of accessing or reading data, particularly related to retrieving target data inside a storage device, while reducing resource consumption (e.g., processing capability, power, bandwidth), improving data accuracy, and resource allocation (e.g., latency).

Figure 14:
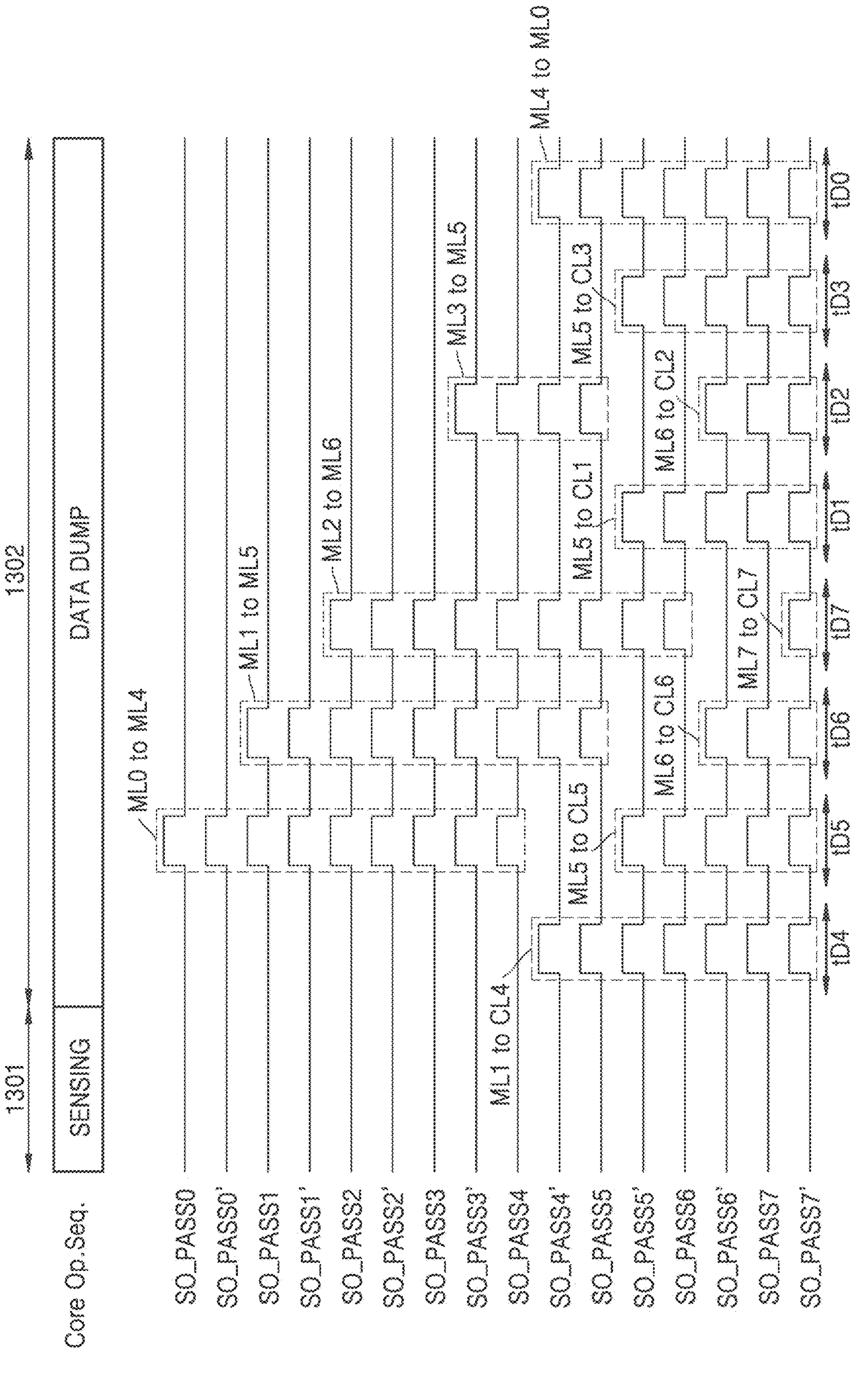
FIG. 14 is a timing diagram of first and second pass control signals according to some example embodiments.

FIG. 14 is a timing diagram of first and second pass control signals according to some example embodiments. FIG. 14 may be described with reference to FIGS. 7 and 13.

Referring to FIG. 14, in a fifth time period tD4, the fifth to eighth sensing nodes SO4 to SO7 may be electrically connected to one another. That is, in the fifth time period tD4, first pass control signals SO_PASS5 to SO_PASS7 and second pass control signals SO_PASS4' to SO_PASS7' may have a high level. However, some example embodiments is not limited thereto, and a first pass control signal SO_PASS4 may have a high level. Also, the fifth to eighth sensing nodes SO4 to SO7 may be electrically connected to the coupling sensing node SOC. In a state where the fifth to eighth sensing nodes SO4 to SO7 are electrically connected to the coupling sensing node SOC, a second data dump operation of transferring fifth data D4 of a fifth main latch ML4 to a fifth cache latch CL4 may be performed.

In the fifth time period tD4, first pass control signals SO_PASS0 to SO_PASS4 and second pass control signals SO_PASS0' to SO_PASS3' may have a low level. That is, the first to fifth sensing nodes SO0 to SO4 may be electrically connected to one another. In some example embodiments, at least two of the first to fourth sensing nodes SO0 to SO3 may be electrically connected to each other. That is, in the fifth time period tD4, a first data dump operation between two or more of first to fourth main latches ML0 to ML3 may be performed.

Referring to FIG. 14, in a sixth time period tD5, the first to fifth sensing nodes SO0 to SO4 may be electrically connected to one another. That is, in the sixth time period tD5, the first pass control signals SO_PASS0 to SO_PASS4 and the second pass control signals SO_PASS0' to SO_PASS3' may have a high level. However, some example embodiments is not limited thereto, and in some example embodiments, the second pass control signal SO_PASS4' may have a high level. In a state where the first to fifth sensing nodes SO0 to SO4 are electrically connected to one another, a first data dump operation of transferring first data DO of a first main latch ML0 to a fifth main latch ML4 may be performed. That is, fifth data D4 of the fifth main latch ML4 may be transferred to the fifth cache latch CL4 in the fifth time period tD4, and thus, even when the page buffer circuit 210*b* caches the first data D0 in the fifth main latch ML4 in the sixth time period tD5, the fifth data D4 may not be lost. The first data D0 may be transferred from the fifth main latch ML4 to a first cache latch CL0 in the first time period tD0.

It has been described that only a first data dump operation between the first main latch ML0 and the fifth main latch ML4 in the sixth time period tD5, but some example embodiments is not limited thereto. In some example embodiments, in the sixth time period tD5, a plurality of first data dump operations between adjacent main latches of the first to fifth main latches ML0 to ML4 may be performed in parallel. For example, a first data dump operation between the first main latch ML0 and the second main latch ML1 and a first data dump operation between the third main latch ML2 and the fourth main latch ML3 may be performed in parallel. That is, in the sixth time period tD5, a plurality of first data dump operations may be performed.

In the sixth time period tD5, the sixth to eighth sensing nodes SO5 to SO7 may be electrically connected to one another. That is, in the sixth time period tD5, first pass control signals SO_PASS6 to SO_PASS7 and second pass control signals SO_PASS5' to SO_PASS7' may have a high level. However, some example embodiments is not limited thereto, and a first pass control signal SO_PASS5 may have a high level. Also, the sixth to eighth sensing nodes SO5 to SO7 may be electrically connected to the coupling sensing node SOC. In a state where the sixth to eighth sensing nodes SO5 to SO7 are electrically connected to the coupling sensing node SOC, a second data dump operation of transferring sixth data D5 of a sixth main latch ML5 to a sixth cache latch CL5 may be performed.

Referring to FIG. 14, in a seventh time period tD6, the second to sixth sensing nodes SO1 to SO5 may be electrically connected to one another. That is, in the seventh time period tD6, the first pass control signals SO_PASS1 to SO_PASS5 and the second pass control signals SO_PASS1' to SO_PASS4' may have a high level. However, some example embodiments is not limited thereto, and in some example embodiments, the second pass control signal SO_PASS5' may have a high level. In the seventh time period tD6, the first and second pass control signals SO_PASS0 to SO_PASS0' may have a low level. In a state where the second to sixth sensing nodes SO1 to SO5 are electrically connected to one another, a first data dump operation of transferring second data D1 of a second main latch ML1 to a sixth main latch ML5 may be performed. That is, sixth data D5 of the sixth main latch ML5 may be transferred to the sixth cache latch CL5 in the sixth time period tD5, and thus, even when the page buffer circuit 210*b* caches the second data D1 in the sixth main latch ML5 in the seventh time period tD6, the sixth data D5 may not be lost. The second data D1 may be transferred from the sixth main latch ML5 to a second cache latch CL1 in the second time period tD1.

In the seventh time period tD6, the seventh and eighth sensing nodes SO6 and SO7 may be electrically connected to each other. That is, in the seventh time period tD6, the first pass control signal SO_PASS7 and the second pass control signals SO_PASS6' and SO_PASS7' may have a high level. However, some example embodiments is not limited thereto, and a first pass control signal SO_PASS6 may have a high level. Also, the seventh and eighth sensing nodes SO6 and SO7 may be electrically connected to the coupling sensing node SOC. In a state where the seventh and eighth sensing nodes SO6 and SO7 are electrically connected to the coupling sensing node SOC, a second data dump operation of transferring seventh data D6 of a seventh main latch ML6 to a seventh cache latch CL6 may be performed. It has been described that only a first data dump operation between the second main latch ML1 and the sixth main latch ML5 in the seventh time period tD6, but some example embodiments is not limited thereto. In some example embodiments, in the seventh time period tD6, a plurality of first data dump operations between adjacent main latches of the second to sixth main latches ML1 to ML5 may be performed in parallel. For example, a first data dump operation between the second main latch ML1 and the third main latch ML2 and a first data dump operation between the fourth main latch ML3 and the fifth main latch ML4 may be performed in parallel. That is, in the seventh time period tD6, a plurality of first data dump operations may be performed.

Referring to FIG. 14, in an eighth time period tD7, the third to seventh sensing nodes SO2 to SO6 may be electrically connected to one another. That is, in the eighth time period tD7, first pass control signals SO_PASS2 to SO_PASS6 and second pass control signals SO_PASS2' to SO_PASS5' may have a high level. However, some example embodiments is not limited thereto, and in some example embodiments, the second pass control signal SO_PASS6' may have a high level. In the eighth time period tD7, the first and second pass control signals SO_PASS0, SO_PASS1, SO_PASS0', and SO_PASS1' may have a low level. In a state where the third to seventh sensing nodes SO2 to SO6 are electrically connected to one another, a first data dump operation of transferring third data D2 of a third main latch ML2 to a third main latch ML6 may be performed. That is, seventh data D6 of the seventh main latch ML6 may be transferred to the seventh cache latch CL6 in the seventh time period tD6, and thus, even when the page buffer circuit 210*b* caches the third data D3 in the seventh main latch ML6 in the eighth time period tD7, the seventh data D6 may not be lost. The third data D2 may be transferred from the seventh main latch ML6 to a third cache latch CL2 in the third time period tD2. It has been described that only a first data dump operation between the third main latch ML2 and the seventh main latch ML6 in the eighth time period tD7, but some example embodiments is not limited thereto. In some example embodiments, in the eighth time period tD7, a plurality of first data dump operations between adjacent main latches of the third to seventh main latches ML2 to ML6 may be performed in parallel. For example, a first data dump operation between the third main latch ML2 and the fourth main latch ML3 and a first data dump operation between the fifth main latch ML4 and the sixth main latch ML5 may be performed in parallel. That is, in the eighth time period tD7, a plurality of first data dump operations may be performed.

In the eighth time period tD7, the eighth sensing node SO7 may be electrically connected to the coupling sensing node SOC. That is, the second pass control signal SO_PASS7' may have a high level. However, some example embodiments is not limited thereto, and the first pass control signal SO_PASS7 may also have a high level. In a state where the eighth sensing node SO7 is electrically connected to the coupling sensing node SOC, a second data dump operation of transferring eighth data D7 of an eighth main latch ML7 to an eighth cache latch CL7 may be performed.

Referring to FIG. 14, in a second time period tD1, the sixth to eighth sensing nodes SO5 to SO7 may be electrically connected to one another. That is, in the second time period tD1, the first pass control signals SO_PASS6 and SO_PASS7 and the second pass control signals SO_PASS5' to SO_PASS7' may have a high level. Also, the sixth to eighth sensing nodes SO5 to SO7 may be electrically connected to the coupling sensing node SOC. However, some example embodiments is not limited thereto, and a first pass control signal SO_PASS5 may have a high level. In a state where the sixth to eighth sensing nodes SO5 to SO7 are electrically connected to the coupling sensing node SOC, a second data dump operation of transferring second data D1 of the sixth main latch ML5 to the second cache latch CL1 may be performed.

In the second time period tD1, the first pass control signals SO_PASS0 to SO_PASS5 and the second pass control signals SO_PASS0' to SO_PASS4' may have a low level. In some example embodiments, the first pass control signal SO_PASS5 may have a high level. That is, the first to fifth sensing nodes SO0 to SO4 may be electrically connected to one another. In some example embodiments, at least two of the first to fifth sensing nodes SO0 to SO4 may be electrically connected to each other. That is, in the second time period tD1, a first data dump operation between two or more of the first to fifth main latches ML0 to ML4 may be performed. That is, in the second time period tD1, it is illustrated that a first data dump operation is not performed, but some example embodiments is not limited thereto. In some example embodiments, in the second time period tD1, at least one first data dump operation between adjacent main latches of the first to fifth main latches ML0 to ML4 may be performed.

Referring to FIG. 14, in a third time period tD2, the fourth to sixth sensing nodes SO3 to SO5 may be electrically connected to one another. That is, in the third time period tD2, the first pass control signals SO_PASS4 and SO_PASS5 and the second pass control signals SO_PASS3' and SO_PASS4' may have a high level. However, some example embodiments is not limited thereto, and in some example embodiments, the first pass control signals SO_PASS3 or the second pass control signal SO_PASS5' may also have a high level. In the third time period tD2, the first and second pass control signals SO_PASS0 to SO_PASS3 and SO_PASS0' to SO_PASS2' may have a low level. In a state where the fourth to sixth sensing nodes SO3 to SO5 are electrically connected to one another, a first data dump operation of transferring fourth data D3 of the fourth main latch ML3 to the sixth main latch ML5 may be performed. That is, second data D1 of the sixth main latch ML5 may be transferred to the second cache latch CL1 in the second time period tD1, and thus, even when the page buffer circuit **210*b*** caches the fourth data D3 in the sixth main latch ML5 in the third time period tD2, the second data D1 may not be lost. The fourth data D3 may be transferred from the sixth main latch ML5 to the fourth cache latch CL3 in the fourth time period tD3. It has been described that only a first data dump operation between the fourth main latch ML3 and the sixth main latch ML5 in the third time period tD2, but some example embodiments is not limited thereto. In some example embodiments, in the third time period tD2, a first data dump operation between adjacent main latches of the first to third main latches ML0 to ML2 may be performed. For example, a first data dump operation between the first main latch ML0 and the second main latch ML1 may be performed. That is, in the third time period tD2, a plurality of first data dump operations may be performed.

In the third time period tD2, the seventh and eighth sensing nodes SO6 and SO7 may be electrically connected to the coupling sensing node SOC. That is, the first pass control signal SO_PASS7 and the second pass control signals SO_PASS6' and SO_PASS7' may have a high level. However, some example embodiments is not limited thereto, and a first pass control signal SO_PASS6 may have a high level. In a state where the seventh and eighth sensing nodes SO6 and SO7 are electrically connected to the coupling sensing node SOC, a second data dump operation of transferring third data D2 of the seventh main latch ML6 to the third cache latch CL2 may be performed.

Referring to FIG. 14, in a fourth time period tD3, the sixth to eighth sensing nodes SO5 to SO7 may be electrically connected to one another. That is, in the fourth time period tD3, the first pass control signals SO_PASS6 and SO_PASS7 and the second pass control signals SO_PASS5' to SO_PASS7' may have a high level. However, some example embodiments is not limited thereto, and a first pass control signal SO_PASS5 may have a high level. Also, the sixth to eighth sensing nodes SO5 to SO7 may be electrically connected to the coupling sensing node SOC. In a state where the sixth to eighth sensing nodes SO5 to SO7 are electrically connected to the coupling sensing node SOC, a second data dump operation of transferring fourth data D3 of the sixth main latch ML5 to the fourth cache latch CL3 may be performed.

In the fourth time period tD3, the first pass control signals SO_PASS0 to SO_PASS5 and the second pass control signals SO_PASS0' to SO_PASS4' may have a low level. That is, the first to sixth sensing nodes SO0 to SO5 may be electrically connected to one another. In some example embodiments, at least two of the first to fifth sensing nodes SO0 to SO4 may be electrically connected to each other. That is, in the fourth time period tD3, a first data dump operation between two or more of the first to fifth main latches ML0 to ML4 may be performed.

Referring to FIG. 14, in a first time period tD0, the fifth to eighth sensing nodes SO4 to SO7 may be electrically connected to one another. That is, in the first time period tD1, the first pass control signals SO_PASS5 and SO_PASS7 and the second pass control signals SO_PASS4' to SO_PASS7' may have a high level. However, some example embodiments is not limited thereto, and a first pass control signal SO_PASS4 may have a high level. Also, the fifth to eighth sensing nodes SO4 to SO7 may be electrically connected to the coupling sensing node SOC. In a state where the fifth to eighth sensing nodes SO4 to SO7 are electrically connected to the coupling sensing node SOC, a second data dump operation of transferring first data D0 of the fifth main latch ML4 to the first cache latch CL0 may be performed.

In the first time period tD0, first pass control signals SO_PASS0 to SO_PASS4 and second pass control signals SO_PASS0' to SO_PASS3' may have a low level. That is, the first to fifth sensing nodes SO0 to SO4 may be electrically connected to one another. In some example embodiments, at least two of the first to fourth sensing nodes SO0 to SO3 may be electrically connected to each other. That is, in the first time period tD0, a first data dump operation between two or more of first to fourth main latches ML0 to ML3 may be performed.

FIG. 14, it is illustrated that a maximum of one first data dump operation is performed in each of the first to eighth time periods tD0 to tD7, but some example embodiments is not limited thereto. In some example embodiments, a plurality of first data dump operations may be performed in parallel in each of the first to eighth time periods tD0 to tD7.

Figure 15:
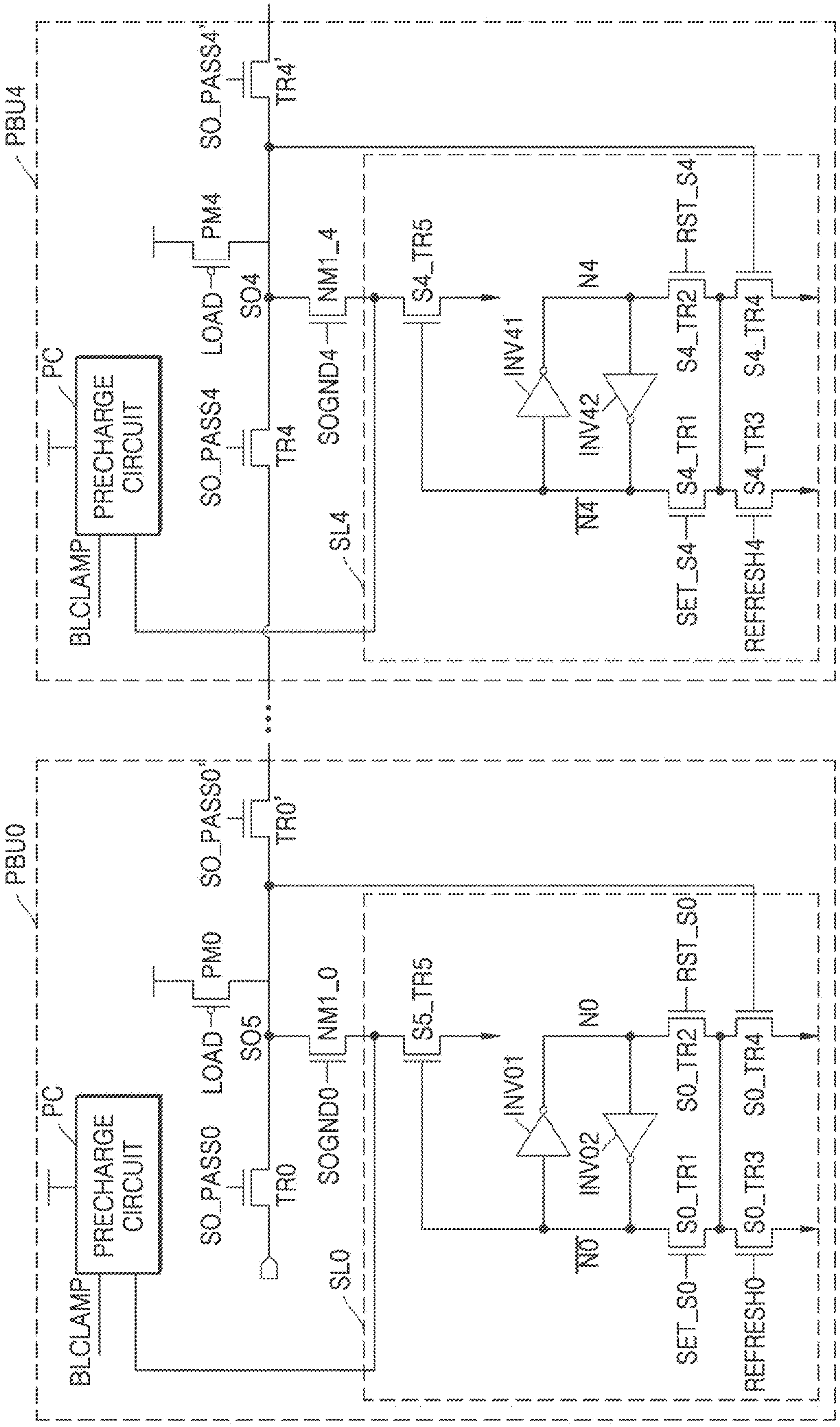
FIG. 15 is a circuit diagram describing a first data dump operation.
Figure 16:
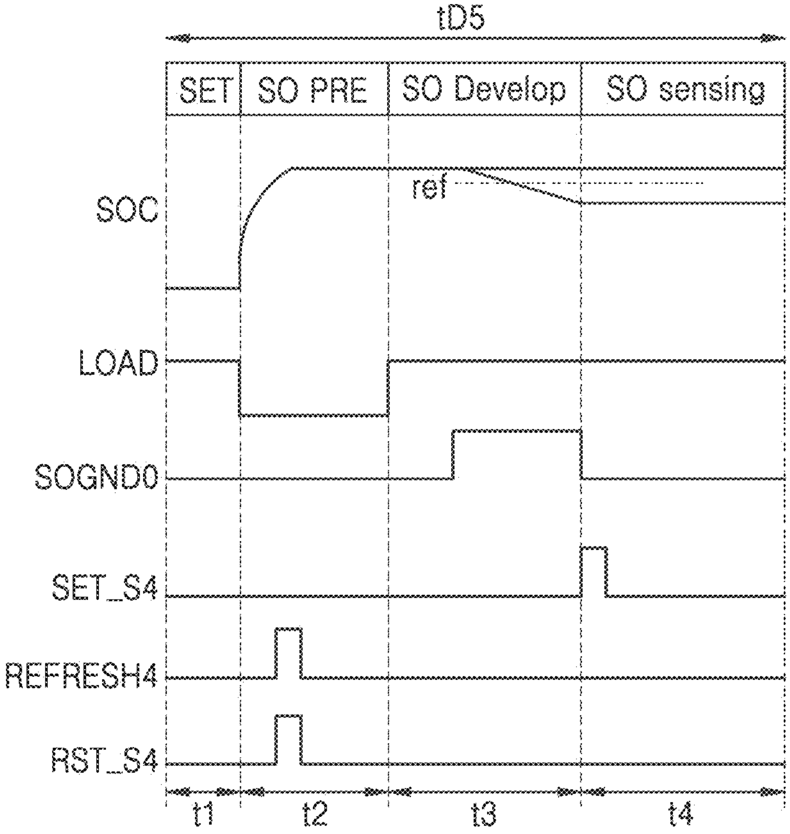
FIG. 16 is a timing diagram of the first data dump operation.

FIG. 15 is a circuit diagram to describe a first data dump operation. FIG. 16 is a timing diagram of the first data dump operation.

In detail, FIGS. 15 and 16 may describe a first data dump operation between a first main latch ML0 and a fifth main latch ML4 in the sixth time period tD5 of FIG. 14.

Referring to FIG. 15, first and fifth page buffer units PBU0 and PBU4 may have the same structure as that of the page buffer unit PBU of FIG. 6. For example, each of the first and fifth page buffer units PBU0 and PBU4 may further include a force latch FL, an upper bit latch MBL, and a lower bit latch LBL.

A first sensing latch SL0 of the first page buffer unit PBU0 may include first and second inverters INV01 and INV02 and transistors S0_TR1 to S0_TR5. The first and second inverters INV01 and INV02 may be cross-coupled to each other and may be connected to nodes N0 and $\overline{N0}$. Levels of the nodes N0 and $\overline{N0}$ may be opposite to each other. The transistor S0_TR1 may be driven by a set signal SET_S0, the transistor S0_TR2 may be driven by a reset signal RST_S0, the transistor S0_TR3 may be driven by a refresh signal REFRESH0, the transistor S0_TR4 may be driven by a level of a first sensing node SO0, and the transistor S0_TR5 may be driven by a level of the node $\overline{N0}$. When the transistor S0_TR3 or the transistor S0_TR4 is turned on, the transistor S0_TR1 may be turned on and may thus discharge the node $\overline{N0}$. When the transistor S0_TR3 or the transistor S0_TR4 is turned on, the transistor S0_TR2 may be turned on and may thus discharge the node N0. A transistor NM1_0 may be driven by a ground control signal SOGND0. The transistors NM1_0 and S0_TR5 may be turned on and may thus discharge the first sensing node SO0.

A fifth sensing latch SL4 of the fifth page buffer unit PBU4 may include first and second inverters INV41 and INV42 and transistors S4_TR1 to S4_TR5. The first and second inverters INV41 and INV42 may be cross-coupled to each other and may be connected to nodes N4 and $\overline{N4}$. Levels of the nodes N4 and $\overline{N4}$ may be opposite to each other. The transistor S4_TR1 may be driven by a set signal SET_S4, the transistor S4_TR2 may be driven by a reset signal RST_S4, the transistor S4_TR3 may be driven by a refresh signal REFRESH4, the transistor S4_TR4 may be driven by a level of a fifth sensing node SO4, and the transistor S4_TR5 may be driven by a level of the node $\overline{N4}$. When the transistor S4_TR3 or the transistor S4_TR4 is turned on, the transistor S4_TR1 may be turned on and may thus discharge the node N4. When the transistor S4_TR3 or the transistor S4_TR4 is turned on, the transistor S4_TR2 may be turned on and may thus discharge the node N4. A transistor NM1_4 may be driven by a ground control signal SOGND4. The transistors NM1_4 and S4_TR5 may be turned on and may thus discharge the fifth sensing node SO4.

Referring to FIG. 14, a first data dump operation between the first main latch ML0 and the fifth main latch ML4 may be performed in the sixth time period tD5. The first sensing latch SL0 of FIG. 15 may correspond to the first main latch ML0 of FIG. 14, and the fifth sensing latch SL4 of FIG. 15 may correspond to the fifth main latch ML4 of FIG. 14.

Referring to FIG. 16, the sixth time period tD5 may include a set period t1, an SO precharge period t2, an SO develop period t3, and an SO sensing period t4. The first data D1 sensed in the data sensing period 1301 of FIG. 13 may be stored in the node N0 of the first sensing latch SL0.

In the SO precharge period t2, the reset signal RST_S4 and the refresh signal REFRESH4 may have a high level. Therefore, the transistors S4_TR2 and S4_TR3 may be turned on, the node N4 may be discharged, '1' may be stored in the node $\overline{N4}$, and 'O' may be stored in the node N4. Simultaneously, a load signal LOAD may have a low level, and a transistor PM4 may precharge the fifth sensing node SO4. Although not shown, in the SO precharge period t2, the first to fourth sensing nodes SO0 to SO3 may also be precharged. However, some example embodiments is not limited thereto, and in the set period t1, the reset signal RST_S4 and the refresh signal REFRESH4 may have a high level. Therefore, the transistors S4_TR2 and S4_TR3 may be turned on, the node N4 may be discharged, 1 may be stored in the node $\overline{N4}$, and 0 may be stored in the node N4.

In the SO develop period t3, the ground control signal SOGND0 may have a high level. Accordingly, the transistor NM1_0 may be turned on. When '0' is stored in the node N0, the transistor S0_TR5 may be turned on and may thus discharge the first sensing node SO0. As described above with reference to FIG. 14, because the first to fifth sensing nodes SO0 to SO4 are electrically connected to one another in the sixth time period tD5, the first sensing node SO0 may be discharged, and thus, the fifth sensing node SO4 may also be discharged. When '[0]1' is stored in the node N0, the transistor S0_TR5 may be turned off, and the first sensing node SO0 may not be discharged.

In the SO sensing period t4, the set signal SET_S4 may have a high level. Accordingly, the transistor S4_TR1 may be turned on. When a level of the fifth sensing node SO4 is higher than a reference level ref, the transistor S4_TR4 may be turned on, and the transistors S4_TR1 and S4_TR4 may discharge the node $\overline{N4}$. Accordingly, data of the node N4 may be changed from '0' to '1'. When a level of the fifth sensing node SO4 is lower than the reference level ref, the transistor S4_TR4 may be turned off, and data of the node N4 may be maintained to be '0'. The reference level ref may denote a threshold voltage level of the transistor S4_TR4. The reference level ref may be referred to as a sensing trip level.

That is, the first data D1 of the node N0 may be transferred to the node N4 through the first data dump operation of the sixth time period tD5. However, some example embodiments is not limited thereto, the first data D1 may be stored in one of the nodes $\overline{N0}$ and N0, and the first data D1 may be transferred to one of the nodes $\overline{N4}$ and N4 through the first data dump operation.

Figure 17:
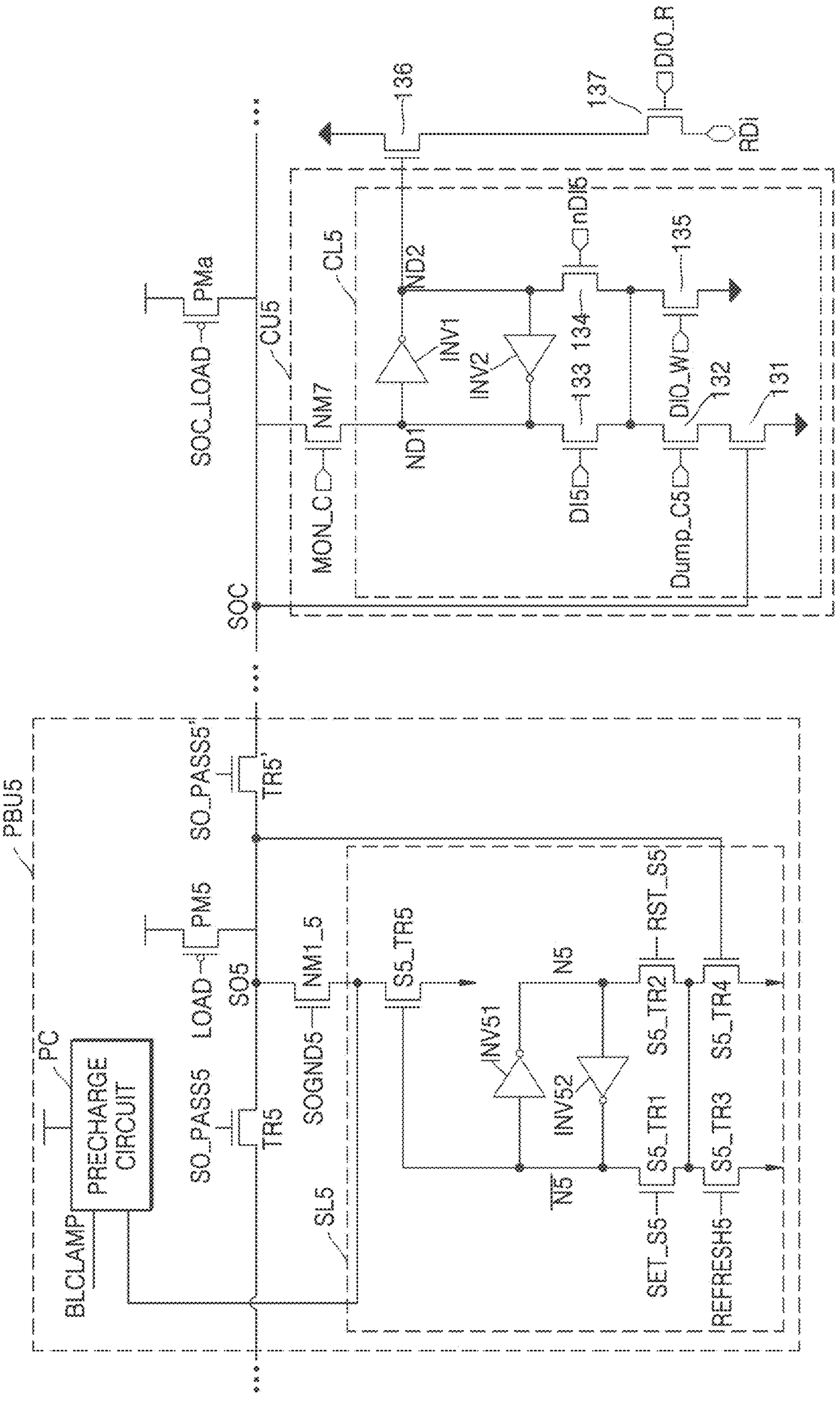
FIG. 17 is a circuit diagram describing a second data dump operation.
Figure 18:
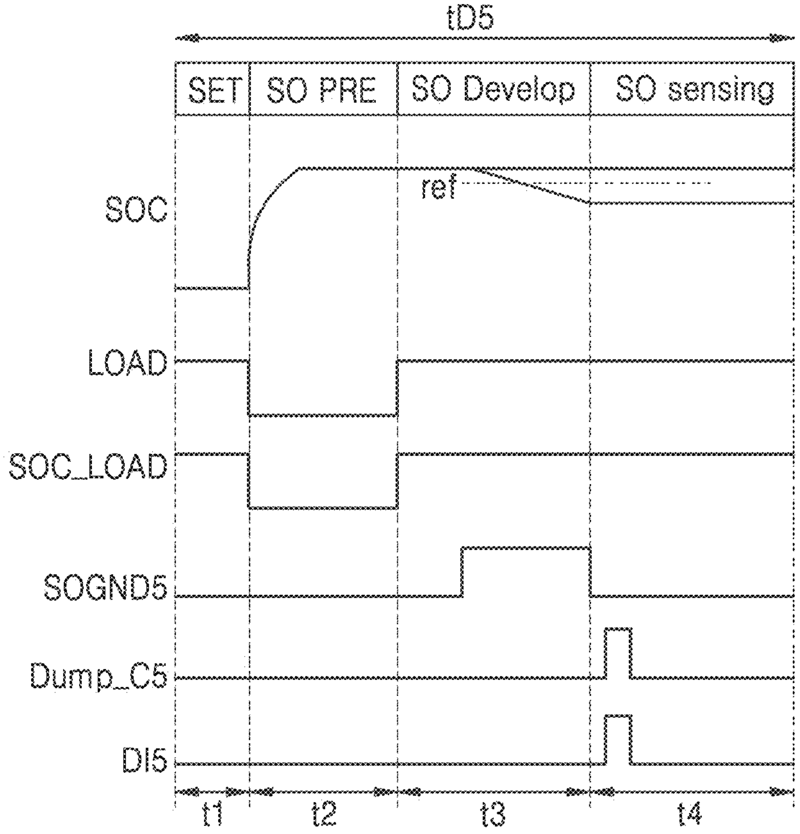
FIG. 18 is a timing diagram of the second data dump operation.

FIG. 17 is a circuit diagram to describe a second data dump operation. FIG. 18 is a timing diagram of the second data dump operation.

In detail, FIGS. 17 and 18 may describe a second data dump operation between a sixth main latch ML5 and a sixth cache latch CL5 in the sixth time period tD5 of FIG. 14.

Referring to FIG. 17, a sixth page buffer unit PBU5 may have the same structure as that of the page buffer unit PBU of FIG. 6. For example, the sixth page buffer unit PBU5 may further include a force latch FL, an upper bit latch MBL, and a lower bit latch LBL.

A sixth sensing latch SL5 of the sixth page buffer unit PBU5 may include first and second inverters INV51 and INV52 and transistors S5_TR1 to S5_TR5. The first and second inverters INV51 and INV52 may be cross-coupled to each other and may be connected to nodes N5 and $\overline{N5}$. Levels of the nodes N5 and $\overline{N5}$ may be opposite to each other. The transistor S5_TR1 may be driven by a set signal SET_S5, the transistor S5_TR2 may be driven by a reset signal RST_S5, the transistor S5_TR3 may be driven by a refresh signal REFRESH5, the transistor S5_TR4 may be driven by a level of a sixth sensing node SO5, and the transistor S5_TR5 may be driven by a level of the node $\overline{N5}$. When the transistor S5_TR3 or the transistor S5_TR4 is turned on, the transistor S5_TR1 may be turned on and may thus discharge the node $\overline{N5}$. When the transistor S5_TR3 or the transistor S5_TR4 is turned on, the transistor S5_TR2 may be turned on and may thus discharge the node N5. A transistor NM1_5 may be driven by a ground control signal SOGND5. The transistors NM1_5 and S5_TR5 may be turned on and may thus discharge the sixth sensing node SO5.

A sixth cache CU5 may include a monitor transistor NM7 and a sixth cache latch CL5, and the sixth cache latch CL5 may include first and second inverters INV1 and INV2, a dump transistor 132, and transistors 131 and 133 to 135. The monitor transistor NM7 may be driven based on a cache monitoring signal MON_C and may control a connection between the coupling sensing node SOC and the sixth cache latch CL5.

The first inverter INV1 may be connected between a first node ND1 and a second node ND2, the second inverter INV2 may be connected between the first node ND1 and the second node ND2, and the first and second inverters INV1 and INV2 may configure a latch. The transistor 131 may include a gate connected to the coupling sensing node SOC. The transistor 132 may be driven by a sixth dump signal Dump_C5. The transistor 133 may be driven by a sixth data signal DI5, the transistor 134 may be driven by a sixth data inversion signal nDI5, and the transistor 135 may be driven by a write control signal DIO_W. When the write control signal DIO_W is activated, voltage levels of the first and second nodes ND1 and ND2 may be determined based on the sixth data signal DI5 and the sixth data inversion signal nDI5.

The sixth cache unit CU5 may be connected to an I/O terminal RDi through the transistors 136 and 137. The transistor 136 may include a gate connected to the second node ND and may be turned on or off based on a voltage level of the second node ND2. The transistor 137 may be driven by a read control signal DIO_R. When the read control signal DIO_R is activated and thus the transistor 137 is turned on, a voltage level of the I/O terminal RDi may be determined to be '1' or '0', based on a state of the sixth cache latch CL5.

Referring to FIG. 14, a second data dump operation between the sixth main latch ML5 and the sixth cache latch CL5 may be performed in the sixth time period tD5. The sixth sensing latch SL5 of FIG. 17 may correspond to the sixth main latch ML5 of FIG. 14, and the sixth cache latch CL5 of FIG. 17 may correspond to the sixth cache latch CL5 of FIG. 14.

Referring to FIG. 18, the sixth data D5 sensed in the data sensing period 1301 of FIG. 13 may be stored in the node N5 of the sixth sensing latch SL5. Furthermore, the first node ND1 of the sixth cache latch CL5 may be previously set to store '1', and the second node ND2 may be previously set to store '0'.

In an SO precharge period t2, a load signal LOAD and a coupling sensing node load signal SOC_LOAD may have a low level, a transistor PM5 may precharge the sixth sensing node SO5, and a transistor PMa may precharge the coupling sensing node SOC. Although not shown, in the SO precharge period t2, seventh and eighth sensing nodes SO6 and SO7 disposed between the sixth sensing node SO5 and the coupling sensing node SOC may be precharged.

In an SO develop period t3, a ground control signal SOGND5 may have a high level. Accordingly, the transistor NM1_5 may be turned on. When 'O' is stored in the node N5, the transistor S5_TR5 may be turned on and may thus discharge the sixth sensing node SO5. As described above with reference to FIG. 14, because the sixth to eighth sensing nodes SO5 to SO7 are electrically connected to the coupling sensing node SOC in the sixth time period tD5, the sixth sensing node SO5 may be discharged, and thus, the coupling sensing node SOC may also be discharged. When '1' is stored in the node N5, the transistor S5_TR5 may be turned off, and the sixth sensing node SO5 may not be discharged.

In an SO sensing period t4, a sixth dump control signal Dump_c5 and a sixth data signal DI5 may have a high level. Accordingly, the transistors 133 and 132 may be turned on. When a level of the coupling sensing node SOC is higher than the reference level ref, the transistor 131 may be turned on, and the transistors 131 to 133 may discharge the first node ND1. Accordingly, data of the node ND1 may be changed from '1' to '0'. When a level of the coupling sensing node SOC is lower than the reference level ref, the transistor 131 may be turned off, and data of the first node ND1 may be maintained to be '1'. The reference level ref may denote a threshold voltage level of the transistor 131. The reference level ref may be referred to as a sensing trip level.

That is, the sixth data D5 of the node N5 may be transferred to the first node ND1 through the second data dump operation of the sixth time period tD5. However, some example embodiments is not limited thereto, the sixth data D5 may be stored in one of the nodes $\overline{N5}$ and N5, and the sixth data D5 may be transferred to one of the first and second nodes ND1 and ND2 through the second data dump operation.

Figure 19:
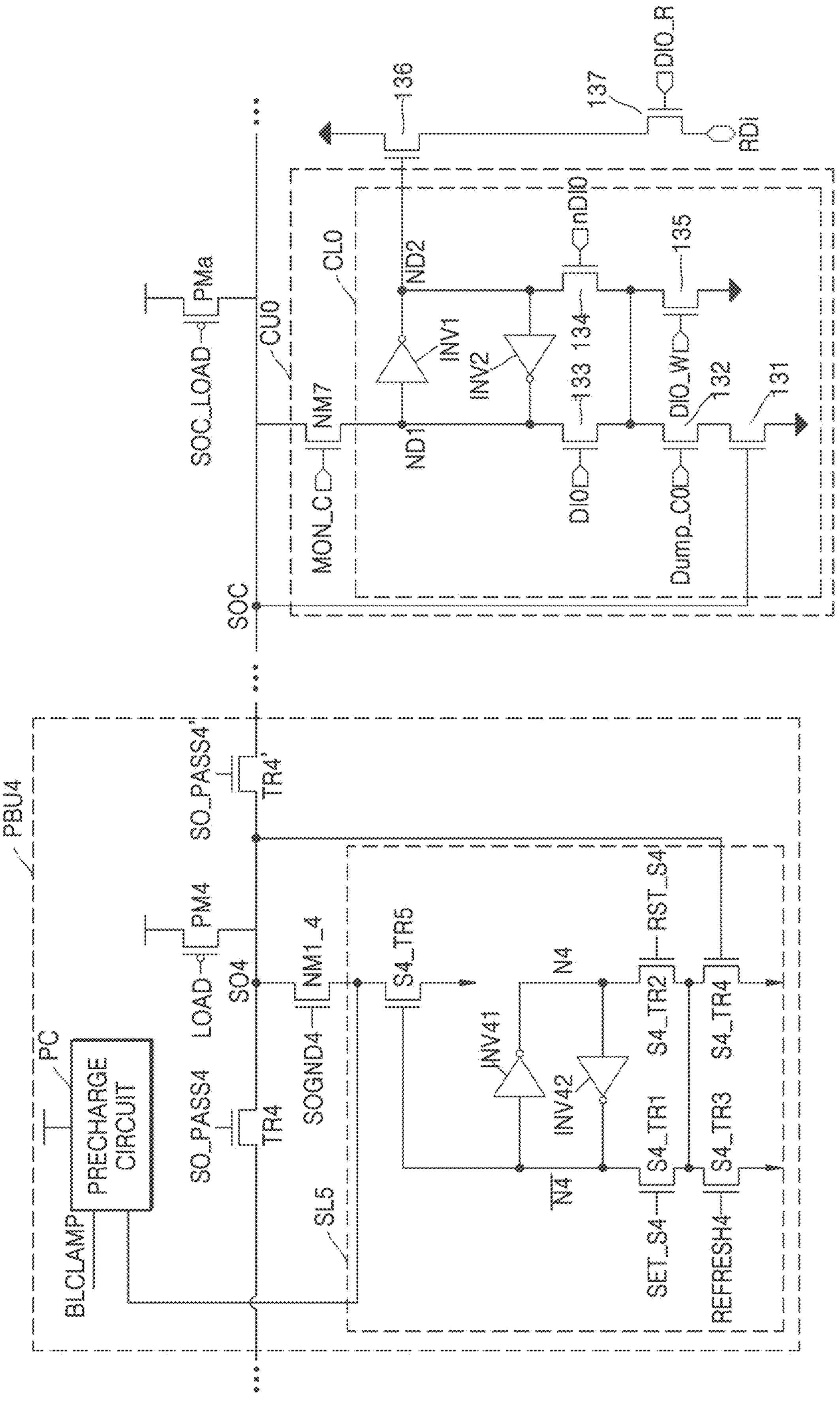
FIG. 19 is a circuit diagram describing a second data dump operation.
Figure 20:
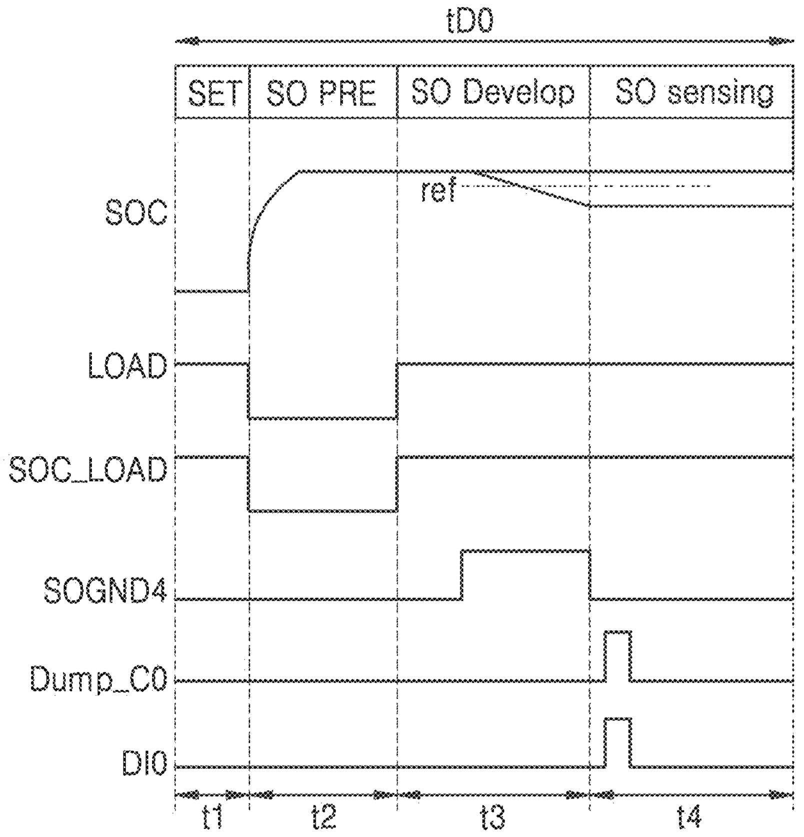
FIG. 20 is a timing diagram of the second data dump operation.

FIG. 19 is a circuit diagram to describe a second data dump operation. FIG. 20 is a timing diagram of the second data dump operation.

In detail, FIGS. 19 and 20 may describe a second data dump operation between a fifth main latch ML4 and a first cache latch CL0 in the first time period tD0 of FIG. 14.

The descriptions given above with reference to the sixth page buffer unit PBU5 and the sixth cache unit CU5 of FIG. 17 may be omitted.

Referring to FIG. 14, a second data dump operation between the fifth main latch ML4 and the first cache latch CL0 may be performed in the first time period tD0. The fifth sensing latch SL4 of FIG. 19 may correspond to the fifth main latch ML4 of FIG. 14, and the first cache latch CL0 of FIG. 19 may correspond to the first cache latch CL0 of FIG. 14.

As described above with reference to FIGS. 15 and 16, in the sixth time period tD5, the first data D0 may be transferred from the first main latch ML0 to the fifth main latch ML4. That is, FIG. 19, the first data D0 may be stored in the node N4 of the fifth sensing latch SL4.

That is, referring to FIG. 20, the first data D0 may be stored in the node N4 of the fifth sensing latch SL4 before the first time period tD0. Also, the first node ND1 of the first cache latch CL0 may be previously set to store '1', and the second node ND2 may be previously set to store '0'.

In an SO precharge period t2, a load signal LOAD and a coupling sensing node load signal SOC_LOAD may have a low level, a transistor PM4 may precharge the fifth sensing node SO4, and a transistor PMa may precharge the coupling sensing node SOC. Although not shown, in the SO precharge period t2, sixth to eighth sensing nodes SO5 to SO7 disposed between the fifth sensing node SO4 and the coupling sensing node SOC may also be precharged.

In an SO develop period t3, a ground control signal SOGND4 may have a high level. Accordingly, the transistor NM1_4 may be turned on. When '0' is stored in the node N4, the transistor S4_TR5 may be turned on and may thus discharge the fifth sensing node SO4. As described above with reference to FIG. 14, because the fifth to eighth sensing nodes SO4 to SO7 are electrically connected to the coupling sensing node SOC in the first time period tD0, the fifth sensing node SO4 may be discharged, and thus, the coupling sensing node SOC may also be discharged. When '1' is stored in the node N4, the transistor S4_TR5 may be turned off, and the fifth sensing node SO4 may not be discharged.

In an SO sensing period t4, a first dump control signal Dump_C0 and a first data signal DI0 may have a high level. Accordingly, the transistors 133 and 132 may be turned on. When a level of the coupling sensing node SOC is higher than the reference level ref, the transistor 131 may be turned on, and the transistors 131 to 133 may discharge the first node ND1. Accordingly, data of the node ND1 may be changed from '1' to '0'. When a level of the coupling sensing node SOC is lower than the reference level ref, the transistor 131 may be turned off, and data of the first node ND1 may be maintained to be '1'. The reference level ref may denote a threshold voltage level of the transistor 131. The reference level ref may be referred to as a sensing trip level.

That is, the first data D0 of the node N4 may be transferred to the first node ND1 through the second data dump operation of the sixth time period tD5. However, some example embodiments is not limited thereto, the first data D0 may be transferred to one of the nodes $\overline{N4}$ and N4 through the first data dump operation of the sixth time period tD5, and the first data D0 may be transferred to one of the first and second nodes ND1 and ND2 through the second data dump operation in the first time period tD0.

Figure 21:
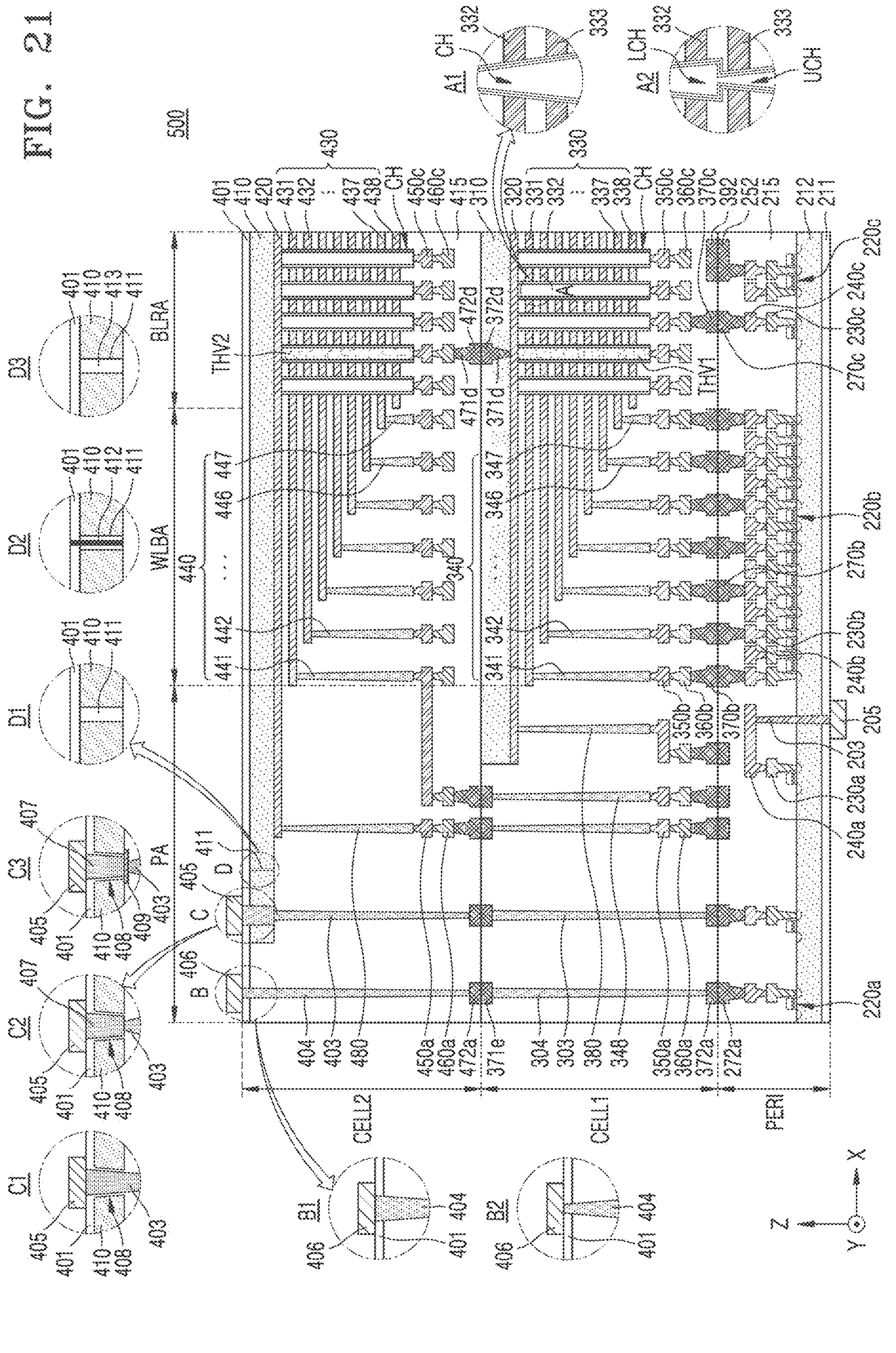
FIG. 21 is a diagram for describing a memory device according to some example embodiments.

FIG. 21 is a view illustrating a memory device 500 according to some example embodiments of the inventive concepts.

Referring to FIG. 21, the memory device 500 may have a chip-to-chip (C2C) structure. At least one upper chip including a cell region and a lower chip including a peripheral circuit region PERI may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 500 may include the at least one upper chip including the cell region. For example, as illustrated in FIG. 21, the memory device 500 may include two upper chips. However, the number of the upper chips is not limited thereto. In the case in which the memory device 500 includes the two upper chips, a first upper chip including a first cell region CELL1, a second upper chip including a second cell region CELL2 and the lower chip including the peripheral circuit region PERI may be manufactured separately, and then, the first upper chip, the second upper chip and the lower chip may be connected to each other by the bonding method to manufacture the memory device 500. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In other words, an upper portion of the lower chip may mean an upper portion defined based on a +Z-axis direction, and the upper portion of each of the first and second upper chips may mean an upper portion defined based on a −Z-axis direction in FIG. 21. However, embodiments of the inventive concepts are not limited thereto. In some example embodiments, one of the first upper chip and the second upper chip may be turned over and then may be connected to a corresponding chip by the bonding method.

Each of the peripheral circuit region PERI and the first and second cell regions CELL1 and CELL2 of the memory device 500 may include an external pad bonding region PA, a word line bonding region WLBA, and a bit line bonding region BLBA.

The peripheral circuit region PERI may include a first substrate 212 and a plurality of circuit elements 220*a*, 220*b* and 220*c* formed on the first substrate 212. An interlayer insulating layer 215 including one or more insulating layers may be provided on the plurality of circuit elements 220*a*, 220*b* and 220*c*, and a plurality of metal lines electrically connected to the plurality of circuit elements 220*a*, 220*b* and 220*c* may be provided in the interlayer insulating layer 215. For example, the plurality of metal lines may include first metal lines 230*a*, 230*b* and 230*c* connected to the plurality of circuit elements 220*a*, 220*b* and 220*c*, and second metal lines 240*a*, 240*b* and 240*c* formed on the first metal lines 230*a*, 230*b* and 230*c*. The plurality of metal lines may be formed of at least one of various conductive materials. For example, the first metal lines 230*a*, 230*b* and 230*c* may be formed of tungsten having a relatively high electrical resistivity, and the second metal lines 240*a*, 240*b* and 240*c* may be formed of copper having a relatively low electrical resistivity.

The first metal lines 230*a*, 230*b* and 230*c* and the second metal lines 240*a*, 240*b* and 240*c* are illustrated and described in the some example embodiments. However, embodiments of the inventive concepts are not limited thereto. In some example embodiments, at least one or more additional metal lines may further be formed on the second metal lines 240*a*, 240*b* and 240*c*. In this case, the second metal lines 240*a*, 240*b* and 240*c* may be formed of aluminum, and at least some of the additional metal lines formed on the second metal lines 240*a*, 240*b* and 240*c* may be formed of copper having an electrical resistivity lower than that of aluminum of the second metal lines 240*a*, 240*b* and 240*c*.

The interlayer insulating layer 215 may be disposed on the first substrate 212 and may include an insulating material such as silicon oxide and/or silicon nitride.

Each of the first and second cell regions CELL1 and CELL2 may include at least one memory block. The first cell region CELL1 may include a second substrate 310 and a common source line 320. A plurality of word lines 330 (331 to 338) may be stacked on the second substrate 310 in a direction (e.g., the Z-axis direction) perpendicular to a top surface of the second substrate 310. String selection lines and a ground selection line may be disposed on and under the word lines 330, and the plurality of word lines 330 may be disposed between the string selection lines and the ground selection line. Likewise, the second cell region CELL2 may include a third substrate 410 and a common source line 420, and a plurality of word lines 430 (431 to 438) may be stacked on the third substrate 410 in a direction (e.g., the Z-axis direction) perpendicular to a top surface of the third substrate 410. Each of the second substrate 310 and the third substrate 410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CELL1 and CELL2.

In some example embodiments, as illustrated in a region 'A1', the channel structure CH may be provided in the bit line bonding region BLBA and may extend in the direction perpendicular to the top surface of the second substrate 310 to penetrate the word lines 330, the string selection lines, and the ground selection line. The channel structure CH may include a data storage layer, a channel layer, and a filling insulation layer. The channel layer may be electrically connected to a first metal line 350*c* and a second metal line 360*c* in the bit line bonding region BLBA. For example, the second metal line 360*c* may be a bit line and may be connected to the channel structure CH through the first metal line 350*c*. The bit line 360*c* may extend in a first direction (e.g., a Y-axis direction) parallel to the top surface of the second substrate 310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 310 to penetrate the common source line 320 and lower word lines 331 and 332. The lower channel LCH may include a data storage layer, a channel layer, and a filling insulation layer and may be connected to the upper channel UCH. The upper channel UCH may penetrate upper word lines 333 to 338. The upper channel UCH may include a data storage layer, a channel layer, and a filling insulation layer, and the channel layer of the upper channel UCH may be electrically connected to the first metal line 350*c* and the second metal line 360*c*. As a length of a channel increases, due to characteristics of manufacturing processes, it may be difficult to form a channel having a substantially uniform or uniform width. The memory device 500 according to the some example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word line located near to a boundary between the lower channel LCH and the upper channel UCH may be a dummy word line. For example, the word lines 332 and 333 adjacent to the boundary between the lower channel LCH and the upper channel UCH may be the dummy word lines. In this case, data may not be stored in memory cells connected to the dummy word line. Alternatively, the number of pages corresponding to the memory cells connected to the dummy word line may be less than the number of pages corresponding to the memory cells connected to a general word line. A level of a voltage applied to the dummy word line may be different from a level of a voltage applied to the general word line, and thus it is possible to reduce an influence of a non-uniform channel width between the lower and upper channels LCH and UCH on an operation of the memory device.

Meanwhile, the number of the lower word lines 331 and 332 penetrated by the lower channel LCH is less than the number of the upper word lines 333 to 338 penetrated by the upper channel UCH in the region 'A2'. However, embodiments of the inventive concepts are not limited thereto. In some example embodiments, the number of the lower word lines penetrated by the lower channel LCH may be equal to or more than the number of the upper word lines penetrated by the upper channel UCH. In addition, structural features and connection relation of the channel structure CH disposed in the second cell region CELL2 may be substantially the same or the same as those of the channel structure CH disposed in the first cell region CELL1.

In the bit line bonding region BLBA, a first through-electrode THV1 may be provided in the first cell region CELL1, and a second through-electrode THV2 may be provided in the second cell region CELL2. As illustrated in FIG. 21, the first through-electrode THV1 may penetrate the common source line 320 and the plurality of word lines 330. In some example embodiments, the first through-electrode THV1 may further penetrate the second substrate 310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 372*d* and a second through-metal pattern 472*d*. The first through-metal pattern 372*d* may be formed at a bottom end of the first upper chip including the first cell region CELL1, and the second through-metal pattern 472*d* may be formed at a top end of the second upper chip including the second cell region CELL2. The first through-electrode THV1 may be electrically connected to the first metal line 350*c* and the second metal line 360*c*. A lower via 371*d* may be formed between the first through-electrode THV1 and the first through-metal pattern 372*d*, and an upper via 471*d* may be formed between the second through-electrode THV2 and the second through-metal pattern 472*d*.

The first through-metal pattern 372*d* and the second through-metal pattern 472*d* may be connected to each other by the bonding method.

In addition, in the bit line bonding region BLBA, an upper metal pattern 252 may be formed in an uppermost metal layer of the peripheral circuit region PERI, and an upper metal pattern 392 having the same shape as the upper metal pattern 252 may be formed in an uppermost metal layer of the first cell region CELL1. The upper metal pattern 392 of the first cell region CELL1 and the upper metal pattern 252 of the peripheral circuit region PERI may be electrically connected to each other by the bonding method. In the bit line bonding region BLBA, the bit line 360*c* may be electrically connected to a page buffer included in the peripheral circuit region PERI. For example, some of the circuit elements 220*c* of the peripheral circuit region PERI may constitute the page buffer, and the bit line 360*c* may be electrically connected to the circuit elements 220*c* constituting the page buffer through an upper bonding metal pattern 370*c* of the first cell region CELL1 and an upper bonding metal pattern 270*c* of the peripheral circuit region PERI.

Referring again to FIG. 21, in the word line bonding region WLBA, the word lines 330 of the first cell region CELL1 may extend in a second direction (e.g., an X-axis direction) parallel to the top surface of the second substrate 310 and may be connected to a plurality of cell contact plugs 340 (341 to 347). First metal lines 350*b* and second metal lines 360*b* may be sequentially connected onto the cell contact plugs 340 connected to the word lines 330. In the word line bonding region WLBA, the cell contact plugs 340 may be connected to the peripheral circuit region PERI through upper bonding metal patterns 370*b* of the first cell region CELL1 and upper bonding metal patterns 270*b* of the peripheral circuit region PERI.

The cell contact plugs 340 may be electrically connected to a row decoder included in the peripheral circuit region PERI. For example, some of the circuit elements 220*b* of the peripheral circuit region PERI may constitute the row decoder, and the cell contact plugs 340 may be electrically connected to the circuit elements 220*b* constituting the row decoder through the upper bonding metal patterns 370*b* of the first cell region CELL1 and the upper bonding metal patterns 270*b* of the peripheral circuit region PERI. In some example embodiments, an operating voltage of the circuit elements 220*b* constituting the row decoder may be different from an operating voltage of the circuit elements 220*c* constituting the page buffer. For example, the operating voltage of the circuit elements 220*c* constituting the page buffer may be greater than the operating voltage of the circuit elements 220*b* constituting the row decoder.

Likewise, in the word line bonding region WLBA, the word lines 430 of the second cell region CELL2 may extend in the second direction (e.g., the X-axis direction) parallel to the top surface of the third substrate 410 and may be connected to a plurality of cell contact plugs 440 (441 to 447). The cell contact plugs 440 may be connected to the peripheral circuit region PERI through an upper metal pattern of the second cell region CELL2 and lower and upper metal patterns and a cell contact plug 348 of the first cell region CELL1.

In the word line bonding region WLBA, the upper bonding metal patterns 370*b* may be formed in the first cell region CELL1, and the upper bonding metal patterns 270*b* may be formed in the peripheral circuit region PERI. The upper bonding metal patterns 370*b* of the first cell region CELL1 and the upper bonding metal patterns 270*b* of the peripheral circuit region PERI may be electrically connected to each other by the bonding method. The upper bonding metal patterns 370*b* and the upper bonding metal patterns 270*b* may be formed of aluminum, copper, or tungsten.

In the external pad bonding region PA, a lower metal pattern 371*e* may be formed in a lower portion of the first cell region CELL1, and an upper metal pattern 472*a* may be formed in an upper portion of the second cell region CELL2. The lower metal pattern 371*e* of the first cell region CELL1 and the upper metal pattern 472*a* of the second cell region CELL2 may be connected to each other by the bonding method in the external pad bonding region PA. Likewise, an upper metal pattern 372*a* may be formed in an upper portion of the first cell region CELL1, and an upper metal pattern 272*a* may be formed in an upper portion of the peripheral circuit region PERI. The upper metal pattern 372*a* of the first cell region CELL1 and the upper metal pattern 272*a* of the peripheral circuit region PERI may be connected to each other by the bonding method.

Common source line contact plugs 380 and 480 may be disposed in the external pad bonding region PA. The common source line contact plugs 380 and 480 may be formed of a conductive material such as a metal, a metal compound, and/or doped polysilicon. The common source line contact plug 380 of the first cell region CELL1 may be electrically connected to the common source line 320, and the common source line contact plug 480 of the second cell region CELL2 may be electrically connected to the common source line 420. A first metal line 350*a* and a second metal line 360*a* may be sequentially stacked on the common source line contact plug 380 of the first cell region CELL1, and a first metal line 450*a* and a second metal line 460*a* may be sequentially stacked on the common source line contact plug 480 of the second cell region CELL2.

Input/output pads 205, 405 and 406 may be disposed in the external pad bonding region PA. Referring to FIG. 21, a lower insulating layer 211 may cover a bottom surface of the first substrate 212, and a first input/output pad 205 may be formed on the lower insulating layer 211. The first input/output pad 205 may be connected to at least one of a plurality of the circuit elements 220*a* disposed in the peripheral circuit region PERI through a first input/output contact plug 203 and may be separated from the first substrate 212 by the lower insulating layer 211. In addition, a side insulating layer may be disposed between the first input/output contact plug 203 and the first substrate 212 to electrically isolate the first input/output contact plug 203 from the first substrate 212.

An upper insulating layer 401 covering a top surface of the third substrate 410 may be formed on the third substrate 410. A second input/output pad 405 and/or a third input/output pad 406 may be disposed on the upper insulating layer 401. The second input/output pad 405 may be connected to at least one of the plurality of circuit elements 220*a* disposed in the peripheral circuit region PERI through second input/output contact plugs 403 and 303, and the third input/output pad 406 may be connected to at least one of the plurality of circuit elements 220*a* disposed in the peripheral circuit region PERI through third input/output contact plugs 404 and 304.

In some example embodiments, the third substrate 410 may not be disposed in a region in which the input/output contact plug is disposed. For example, as illustrated in a region 'B', the third input/output contact plug 404 may be separated from the third substrate 410 in a direction parallel to the top surface of the third substrate 410 and may penetrate an interlayer insulating layer 415 of the second cell region CELL2 so as to be connected to the third input/output pad 406. In this case, the third input/output contact plug 404 may be formed by at least one of various processes.

In some example embodiments, as illustrated in a region 'B1', the third input/output contact plug 404 may extend in a third direction (e.g., the Z-axis direction), and a diameter of the third input/output contact plug 404 may become progressively greater toward the upper insulating layer 401. In other words, a diameter of the channel structure CH described in the region 'A1' may become progressively less toward the upper insulating layer 401, but the diameter of the third input/output contact plug 404 may become progressively greater toward the upper insulating layer 401. For example, the third input/output contact plug 404 may be formed after the second cell region CELL2 and the first cell region CELL1 are bonded to each other by the bonding method.

In some example embodiments, as illustrated in a region 'B2', the third input/output contact plug 404 may extend in the third direction (e.g., the Z-axis direction), and a diameter of the third input/output contact plug 404 may become progressively less toward the upper insulating layer 401. In other words, like the channel structure CH, the diameter of the third input/output contact plug 404 may become progressively less toward the upper insulating layer 401. For example, the third input/output contact plug 404 may be formed together with the cell contact plugs 440 before the second cell region CELL2 and the first cell region CELL1 are bonded to each other.

In some example embodiments, the input/output contact plug may overlap with the third substrate 410. For example, as illustrated in a region 'C', the second input/output contact plug 403 may penetrate the interlayer insulating layer 415 of the second cell region CELL2 in the third direction (e.g., the Z-axis direction) and may be electrically connected to the second input/output pad 405 through the third substrate 410. In this case, a connection structure of the second input/output contact plug 403 and the second input/output pad 405 may be realized by various methods.

In some example embodiments, as illustrated in a region 'C1', an opening 408 may be formed to penetrate the third substrate 410, and the second input/output contact plug 403 may be connected directly to the second input/output pad 405 through the opening 408 formed in the third substrate 410. In this case, as illustrated in the region 'C1', a diameter of the second input/output contact plug 403 may become progressively greater toward the second input/output pad 405. However, embodiments of the inventive concepts are not limited thereto, and in some example embodiments, the diameter of the second input/output contact plug 403 may become progressively less toward the second input/output pad 405.

In some example embodiments, as illustrated in a region 'C2', the opening 408 penetrating the third substrate 410 may be formed, and a contact 407 may be formed in the opening 408. An end of the contact 407 may be connected to the second input/output pad 405, and another end of the contact 407 may be connected to the second input/output contact plug 403. Thus, the second input/output contact plug 403 may be electrically connected to the second input/output pad 405 through the contact 407 in the opening 408. In this case, as illustrated in the region 'C2', a diameter of the contact 407 may become progressively greater toward the second input/output pad 405, and a diameter of the second input/output contact plug 403 may become progressively less toward the second input/output pad 405. For example, the second input/output contact plug 403 may be formed together with the cell contact plugs 440 before the second cell region CELL2 and the first cell region CELL1 are bonded to each other, and the contact 407 may be formed after the second cell region CELL2 and the first cell region CELL1 are bonded to each other.

In some example embodiments illustrated in a region 'C3', a stopper 409 may further be formed on a bottom end of the opening 408 of the third substrate 410, as compared with the embodiments of the region 'C2'. The stopper 409 may be a metal line formed in the same layer as the common source line 420. Alternatively, the stopper 409 may be a metal line formed in the same layer as at least one of the word lines 430. The second input/output contact plug 403 may be electrically connected to the second input/output pad 405 through the contact 407 and the stopper 409.

Like the second and third input/output contact plugs 403 and 404 of the second cell region CELL2, a diameter of each of the second and third input/output contact plugs 303 and 304 of the first cell region CELL1 may become progressively less toward the lower metal pattern 371*e* or may become progressively greater toward the lower metal pattern 371*e*.

Meanwhile, in some example embodiments, a slit 411 may be formed in the third substrate 410. For example, the slit 411 may be formed at a certain position of the external pad bonding region PA. For example, as illustrated in a region 'D', the slit 411 may be located between the second input/output pad 405 and the cell contact plugs 440 when viewed in a plan view. Alternatively, the second input/output pad 405 may be located between the slit 411 and the cell contact plugs 440 when viewed in a plan view.

In some example embodiments, as illustrated in a region 'D1', the slit 411 may be formed to penetrate the third substrate 410. For example, the slit 411 may be used to prevent or reduce the third substrate 410 from being finely cracked when the opening 408 is formed. However, embodiments of the inventive concepts are not limited thereto, and in some example embodiments, the slit 411 may be formed to have a depth ranging from about or exactly 60% to about or exactly 70% of a thickness of the third substrate 410.

In some example embodiments, as illustrated in a region 'D2', a conductive material 412 may be formed in the slit 411. For example, the conductive material 412 may be used to discharge a leakage current occurring in driving of the circuit elements in the external pad bonding region PA to the outside. In this case, the conductive material 412 may be connected to an external ground line.

In some example embodiments, as illustrated in a region 'D3', an insulating material 413 may be formed in the slit 411. For example, the insulating material 413 may be used to electrically isolate the second input/output pad 405 and the second input/output contact plug 403 disposed in the external pad bonding region PA from the word line bonding region WLBA. Since the insulating material 413 is formed in the slit 411, it is possible to prevent or reduce a voltage provided through the second input/output pad 405 from affecting a metal layer disposed on the third substrate 410 in the word line bonding region WLBA.

Meanwhile, in some example embodiments, the first to third input/output pads 205, 405 and 406 may be selectively formed. For example, the memory device 500 may be realized to include only the first input/output pad 205 disposed on the first substrate 212, to include only the second input/output pad 405 disposed on the third substrate 410, or to include only the third input/output pad 406 disposed on the upper insulating layer 401.

In some example embodiments, at least one of the second substrate 310 of the first cell region CELL1 or the third substrate 410 of the second cell region CELL2 may be used as a sacrificial substrate and may be completely or partially removed before or after a bonding process. An additional layer may be stacked after the removal of the substrate. For example, the second substrate 310 of the first cell region CELL1 may be removed before or after the bonding process of the peripheral circuit region PERI and the first cell region CELL1, and then, an insulating layer covering a top surface of the common source line 320 or a conductive layer for connection may be formed. Likewise, the third substrate 410 of the second cell region CELL2 may be removed before or after the bonding process of the first cell region CELL1 and the second cell region CELL2, and then, the upper insulating layer 401 covering a top surface of the common source line 420 or a conductive layer for connection may be formed.

The Memory cell array 100 of FIG. 1 may be disposed in the first cell region CELL1 and/or the second cell region CELL2. The peripheral circuit 200 of FIG. 1 may be disposed in the peripheral circuit region PERI.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

As described herein, any electronic devices and/or portions thereof according to any of the example embodiments may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a DRAM device, storing a program of instructions, and a processor (e.g., CPU) configured to execute the program of instructions to implement the functionality and/or methods performed by some or all of any devices, systems, modules, units, controllers, circuits, architectures, and/or portions thereof according to any of the example embodiments, and/or any portions thereof.

Hereinabove, some example embodiments have been described in the drawings and the specification. Embodiments have been described by using the terms described herein, but this has been merely used for describing the inventive concepts and has not been used for limiting a meaning or limiting the scope of the inventive concepts defined in the following claims. Therefore, it may be understood by those of ordinary skill in the art that various modifications and other equivalent embodiments may be implemented from the inventive concepts. Accordingly, the spirit and scope of the inventive concepts may be defined based on the spirit and scope of the following claims.

While the inventive concepts have been particularly shown and described with reference to example embodiments thereof, it will be understood that various changes in form and details may be made therein without departing from the spirit and scope of the following claims.

What is claimed is:

1. A memory device comprising:

a memory cell array including a plurality of memory cells; and a page buffer circuit including a plurality of page buffer units respectively connected to the plurality of memory cells through a plurality of bit lines and a plurality of cache latches respectively corresponding to the plurality of page buffer units, each of the plurality of page buffer units comprising a main latch and a pass transistor, each connected to a corresponding sensing node, sensing nodes of at least first, second, and third page buffer units of the plurality of page buffer units connected to one another through pass transistors of the first, second, and third page buffer units, and a main latch of the first page buffer unit configured to perform a first data dump operation of transferring first data to a main latch of the second page buffer unit in a first time period of a data dump period.

2. The memory device of claim 1, wherein a main latch of the third page buffer unit is configured to perform a second data dump operation of transferring second data to a cache latch corresponding to the third page buffer unit in the first time period in parallel with the first data dump operation.

3. The memory device of claim 2, wherein, in the first and second data dump operations, the sensing node of the first page buffer unit is electrically connected to the sensing node of the second page buffer unit, and the sensing nodes of the first and second page buffer units are electrically disconnected from the sensing node of the third page buffer unit.

4. The memory device of claim 2, wherein, in the first and second data dump operations, a pass transistor between the sensing node of the first page buffer unit and the sensing node of the second page buffer unit is turned on, and at least one pass transistor between the sensing node of the first page buffer unit or the second page buffer unit and the sensing node of the third page buffer unit is turned off.

5. The memory device of claim 2, wherein the plurality of cache latches respectively corresponding to the plurality of page buffer units are connected to a coupling sensing node in common, and the first page buffer unit is farther away from the coupling sensing node than the second page buffer unit.

6. The memory device of claim 2, wherein the plurality of cache latches respectively corresponding to the plurality of page buffer units are connected to a coupling sensing node in common, and a distance between the sensing node of the first page buffer unit and the coupling sensing node is greater than a distance between the sensing node of the second page buffer unit and the coupling sensing node.

7. The memory device of claim 1, wherein the main latch of the second page buffer unit is configured to transfer the first data, transferred from the main latch of the first page buffer unit in the first time period, to a cache latch corresponding to the second page buffer unit in a second time period of the data dump period.

8. The memory device of claim 7, wherein the second time period comprises a sensing node pre-charge period, a sensing node develop period, and a sensing node sensing period, and the page buffer circuit is configured to precharge a coupling sensing node connected to the cache latch and the sensing node of the second page buffer unit in the sensing node precharge period, develop the coupling sensing node by using the first data stored in the main latch of the second page buffer unit in the sensing node develop period, and change data of the cache latch in the sensing node sensing period, based on a level of the coupling sensing node.

9. The memory device of claim 1, wherein the first time period comprises a sensing node precharge period, a sensing node develop period, and a sensing node sensing period, and the page buffer circuit is configured to initialize data in the main latch of the second page buffer unit and precharge the sensing nodes of the first page buffer unit and the second page buffer unit in the sensing node precharge period, develop the sensing node of the second page buffer unit by using the first data stored in the main latch of the first page buffer unit in the sensing node develop period, and change data of the main latch of the second page buffer unit in the sensing node sensing period, based on a level of the sensing node of the second page buffer unit.

10. The memory device of claim 1, wherein the main latch comprises one of a sensing latch, a force latch, an upper bit latch, and a lower bit latch.

11. A memory device comprising:
a first semiconductor layer including a plurality of memory cells respectively connected to a plurality of bit lines; and
a second semiconductor layer above the first semiconductor layer, the second semiconductor layer including a page buffer circuit,
the page buffer circuit comprising
a main region including a plurality of page buffer units; and
a cache region including a plurality of cache latches respectively corresponding to the plurality of page buffer units,
each of the plurality of page buffer units comprising a main latch and a pass transistor, each connected to a corresponding sensing node,
sensing nodes of at least first, second, and third page buffer units of the plurality of page buffer units connected to one another through pass transistors of the first, second, and third page buffer units, and
a main latch of the first page buffer unit configured to perform a first data dump operation of transferring first data to a main latch of the second page buffer unit in a first time period of a data dump period.

12. The memory device of claim 11, wherein a main latch of the third page buffer unit is configured to perform a second data dump operation of transferring second data to a cache latch corresponding to the third page buffer unit in the first time period in parallel with the first data dump operation.

13. The memory device of claim 12, wherein, in the first and second data dump operations, the sensing node of the first page buffer unit is electrically connected to the sensing node of the second page buffer unit, and the sensing nodes of the first and second page buffer units are electrically disconnected from the sensing node of the third page buffer unit.

14. The memory device of claim 12, wherein, in the first and second data dump operations, a pass transistor between the sensing node of the first page buffer unit and the sensing node of the second page buffer unit is turned on, and at least one pass transistor between the sensing node of the first page buffer unit or the second page buffer unit and the sensing node of the third page buffer unit is turned off.

15. The memory device of claim 12, wherein the plurality of cache latches respectively corresponding to the plurality of page buffer units are connected to a coupling sensing node in common, and the first page buffer unit is farther away from the coupling sensing node than the second page buffer unit.

16. The memory device of claim 12, wherein the plurality of cache latches respectively corresponding to the plurality of page buffer units are connected to a coupling sensing node in common, and a distance between the sensing node of the first page buffer unit and the coupling sensing node is greater than a distance between the sensing node of the second page buffer unit and the coupling sensing node.

17. The memory device of claim 11, wherein the main latch of the second page buffer unit is configured to transfer the first data, transferred from the main latch of the first page buffer unit in the first time period, to a cache latch corresponding to the second page buffer unit in a second time period of the data dump period.

18. A page buffer circuit comprising:
a plurality of page buffer units; and
a plurality of cache latches connected to the plurality of page buffer units through a coupling sensing node in common,
each of the plurality of page buffer units comprising a main latch and a pass transistor, each connected to a corresponding sensing node,
sensing nodes of at least first, second, and third page buffer units of the plurality of page buffer units connected to one another through pass transistors of the first, second, and third page buffer units, and
a main latch of the first page buffer unit configured to perform a first data dump operation of transferring first data to a main latch of the second page buffer unit in a first time period of a data dump period.

19. The page buffer circuit of claim 18, wherein a main latch of the third page buffer unit is configured to perform a second data dump operation of transferring second data to a cache latch corresponding to the third page buffer unit in the first time period in parallel with the first data dump operation.

20. The page buffer circuit of claim 19, wherein, in the first and second data dump operations, the sensing node of the first page buffer unit is electrically connected to the sensing node of the second page buffer unit, and the sensing nodes of the first and second page buffer units are electrically disconnected from the sensing node of the third page buffer unit.

* * * * *